US009605342B2

(12) United States Patent
Alokozai et al.

(10) Patent No.: US 9,605,342 B2
(45) Date of Patent: Mar. 28, 2017

(54) PROCESS GAS MANAGEMENT FOR AN INDUCTIVELY-COUPLED PLASMA DEPOSITION REACTOR

(71) Applicant: ASM IP Holding B.V., Almere (NL)

(72) Inventors: Fred Alokozai, Scottsdale, AZ (US); Robert Brennan Milligan, Gold Canyon, AZ (US)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 14/659,152

(22) Filed: Mar. 16, 2015

(65) Prior Publication Data

US 2015/0184291 A1 Jul. 2, 2015

Related U.S. Application Data

(63) Continuation of application No. 13/612,538, filed on Sep. 12, 2012, now Pat. No. 9,021,985.

(51) Int. Cl.
*C23C 16/452* (2006.01)
*C23C 16/455* (2006.01)
(Continued)

(52) U.S. Cl.
CPC ...... *C23C 16/452* (2013.01); *C23C 16/45563* (2013.01); *C23C 16/507* (2013.01);
(Continued)

(58) Field of Classification Search
CPC ............ C23C 16/452; C23C 16/45563; C23C 16/507; C23C 16/505; H01L 21/02274;
(Continued)

(56) References Cited

U.S. PATENT DOCUMENTS

D56,051 S 8/1920 Cohn
2,161,626 A 6/1939 Loughner et al.
(Continued)

FOREIGN PATENT DOCUMENTS

CN 1563483 A 1/2005
CN 101330015 A 12/2008
(Continued)

OTHER PUBLICATIONS

USPTO; Final Office Action dated Aug. 12, 2015 in U.S. Appl. No. 12/754,223.

(Continued)

*Primary Examiner* — Julio J Maldonado
*Assistant Examiner* — Stanetta Isaac
(74) *Attorney, Agent, or Firm* — Snell & Wilmer L.L.P.

(57) ABSTRACT

Embodiments related to hardware and methods for processing a semiconductor substrate are disclosed. One example film deposition reactor includes a process gas distributor including a plasma gas-feed inlet located to supply plasma gas to a plasma generation region within the film deposition reactor and a precursor gas-feed inlet located to supply film precursor gas downstream of the plasma generation region; an insulating confinement vessel configured to maintain a plasma generation region at a reduced pressure within the film deposition reactor and an inductively-coupled plasma (ICP) coil arranged around a portion of a sidewall of the insulating confinement vessel and positioned so that the sidewall separates the plasma generation region from the ICP coil; and a susceptor configured to support the semiconductor substrate so that a film deposition surface of the semiconductor substrate is exposed to a reaction region formed downstream of the process gas distributor.

17 Claims, 7 Drawing Sheets

116
118
212
214
208
210
216

(51) Int. Cl.
*C23C 16/507* (2006.01)
*H01J 37/32* (2006.01)
*H01L 21/02* (2006.01)
*H01L 21/285* (2006.01)

(52) U.S. Cl.
CPC ........ *H01J 37/321* (2013.01); *H01J 37/3244* (2013.01); *H01L 21/0262* (2013.01); *H01L 21/02274* (2013.01); *H01L 21/28556* (2013.01); *Y10T 137/6851* (2015.04)

(58) Field of Classification Search
CPC ............ H01L 21/0262; H01L 21/28556; H01J 37/3244; H01J 37/321; H01J 37/3211; H01J 37/32119; Y10T 137/6851
See application file for complete search history.

(56) References Cited

U.S. PATENT DOCUMENTS 2,745,640 A 5/1956 Cushman
2,990,045 A 9/1959 Root
3,089,507 A 5/1963 Drake et al.
3,094,396 A 6/1963 Flugge et al.
3,232,437 A 2/1966 Hultgren
3,833,492 A 9/1974 Bollyky
3,854,443 A 12/1974 Baerg
3,862,397 A 1/1975 Anderson et al.
3,887,790 A 6/1975 Ferguson
4,054,071 A 10/1977 Patejak
4,058,430 A 11/1977 Suntola et al.
4,134,425 A 1/1979 Gussefeld et al.
4,145,699 A 3/1979 Hu et al.
4,164,959 A 8/1979 Wurzburger
4,176,630 A 12/1979 Elmer
4,181,330 A 1/1980 Kojima
4,194,536 A 3/1980 Stine et al.
4,322,592 A 3/1982 Martin
4,389,973 A 6/1983 Suntola et al.
4,393,013 A 7/1983 McMenamin
4,401,507 A 8/1983 Engle
4,414,492 A 11/1983 Hanlet
4,436,674 A 3/1984 McMenamin
4,479,831 A 10/1984 Sandow
4,499,354 A 2/1985 Hill et al.
4,512,113 A 4/1985 Budinger
4,570,328 A 2/1986 Price et al.
4,579,623 A 4/1986 Suzuki et al.
D288,556 S 3/1987 Wallgren
4,653,541 A 3/1987 Oehlschlaeger et al.
4,654,226 A 3/1987 Jackson et al.
4,681,134 A 7/1987 Paris
4,718,637 A 1/1988 Contin
4,722,298 A 2/1988 Rubin et al.
4,735,259 A 4/1988 Vincent
4,753,192 A 6/1988 Goldsmith et al.
4,756,794 A 7/1988 Yoder
4,780,169 A 10/1988 Stark et al.
4,789,294 A 12/1988 Sato et al.
4,821,674 A 4/1989 deBoer et al.
4,827,430 A 5/1989 Aid et al.
4,837,185 A 6/1989 Yau et al.
4,854,263 A 8/1989 Chang et al.
4,857,139 A 8/1989 Tashiro et al.
4,857,382 A 8/1989 Sheng et al.
4,882,199 A 11/1989 Sadoway et al.
4,976,996 A 12/1990 Monkowski et al.
4,978,567 A 12/1990 Miller
4,984,904 A 1/1991 Nakano et al.
4,985,114 A 1/1991 Okudaira
4,986,215 A 1/1991 Yamada
4,987,856 A 1/1991 Hey
4,991,614 A 2/1991 Hammel
5,013,691 A 5/1991 Lory et al.
5,027,746 A 7/1991 Frijlink
5,028,366 A 7/1991 Harakal et al.
5,060,322 A 10/1991 Delepine
5,062,386 A 11/1991 Christensen
5,065,698 A 11/1991 Koike
5,074,017 A 12/1991 Toya et al.
5,098,638 A 3/1992 Sawada
5,104,514 A 4/1992 Quartarone
5,116,018 A 5/1992 Friemoth et al.
D327,534 S 6/1992 Manville
5,119,760 A 6/1992 McMillan et al.
5,167,716 A 12/1992 Boitnott et al.
5,178,682 A 1/1993 Tsukamoto et al.
5,183,511 A 2/1993 Yamazaki et al.
5,192,717 A 3/1993 Kawakami
5,194,401 A 3/1993 Adams et al.
5,199,603 A 4/1993 Prescott
5,221,556 A 6/1993 Hawkins et al.
5,242,539 A 9/1993 Kumihashi et al.
5,243,195 A 9/1993 Nishi
5,246,500 A 9/1993 Samata et al.
5,271,967 A 12/1993 Kramer et al.
5,278,494 A 1/1994 Obigane
5,288,684 A 2/1994 Yamazaki et al.
5,306,946 A 4/1994 Yamamoto
5,310,456 A 5/1994 Kadomura
5,310,698 A 5/1994 Wild
5,315,092 A 5/1994 Takahashi et al.
5,326,427 A 7/1994 Jerbic
5,326,722 A 7/1994 Huang
5,336,327 A 8/1994 Lee
5,354,580 A 10/1994 Goela et al.
5,356,478 A 10/1994 Chen et al.
5,360,269 A 11/1994 Ogawa et al.
5,380,367 A 1/1995 Bertone
5,382,311 A 1/1995 Ishikawa et al.
5,404,082 A 4/1995 Hernandez et al.
5,413,813 A 5/1995 Cruse et al.
5,414,221 A 5/1995 Gardner
5,415,753 A 5/1995 Hurwitt et al.
5,421,893 A 6/1995 Perlov
5,422,139 A 6/1995 Fischer
5,430,011 A 7/1995 Tanaka et al.
5,494,494 A 2/1996 Mizuno et al.
5,496,408 A 3/1996 Motoda et al.
5,504,042 A 4/1996 Cho et al.
5,518,549 A 5/1996 Hellwig
5,527,417 A 6/1996 Iida et al.
5,531,835 A 7/1996 Fodor et al.
5,574,247 A 11/1996 Nishitani et al.
5,577,331 A 11/1996 Suzuki
5,589,002 A 12/1996 Su
5,589,110 A 12/1996 Motoda et al.
5,595,606 A 1/1997 Fujikawa et al.
5,601,641 A 2/1997 Stephens
5,604,410 A 2/1997 Vollkommer et al.
5,616,947 A 4/1997 Tamura
5,621,982 A 4/1997 Yamashita
5,632,919 A 5/1997 MacCracken et al.
D380,527 S 7/1997 Velez
5,679,215 A 10/1997 Barnes et al.
5,681,779 A 10/1997 Pasch et al.
5,683,517 A 11/1997 Shan
5,695,567 A 12/1997 Kordina
5,718,574 A 2/1998 Shimazu
5,724,748 A 3/1998 Brooks
5,728,223 A 3/1998 Murakarni et al.
5,730,801 A 3/1998 Tepman et al.
5,732,744 A 3/1998 Barr et al.
5,736,314 A 4/1998 Hayes et al.
5,781,693 A 7/1998 Ballance et al.
5,782,979 A 7/1998 Kaneno
5,786,027 A 7/1998 Rolfson
5,796,074 A 8/1998 Edelstein et al.
5,801,104 A 9/1998 Schuegraf et al.
5,819,434 A 10/1998 Herchen et al.
5,827,757 A 10/1998 Robinson, Jr. et al.
5,836,483 A 11/1998 Disel
5,837,320 A 11/1998 Hampden-Smith et al.
5,852,879 A 12/1998 Schumaier

(56) References Cited

U.S. PATENT DOCUMENTS 5,853,484 A 12/1998 Jeong
5,855,680 A 1/1999 Soininen et al.
5,855,681 A 1/1999 Maydan et al.
5,873,942 A 2/1999 Park
5,877,095 A 3/1999 Tamura et al.
5,888,876 A 3/1999 Shiozawa et al.
5,908,672 A 6/1999 Ryu
5,916,365 A 6/1999 Sherman
5,920,798 A 7/1999 Higuchi et al.
5,968,275 A 10/1999 Lee et al.
5,975,492 A 11/1999 Brenes
5,979,506 A 11/1999 Aarseth
5,997,588 A 12/1999 Goodwin
D419,652 S 1/2000 Hall et al.
6,013,553 A 1/2000 Wallace et al.
6,015,465 A 1/2000 Kholodenko et al.
6,017,779 A 1/2000 Miyasaka
6,024,799 A 2/2000 Chen
6,035,101 A 3/2000 Sajoto et al.
6,042,652 A 3/2000 Hyun
6,044,860 A 4/2000 Nue
6,048,154 A 4/2000 Wytman
6,050,506 A 4/2000 Guo et al.
6,060,691 A 5/2000 Minami et al.
6,067,680 A 5/2000 Pan et al.
6,074,443 A 6/2000 Venkatesh
6,083,321 A 7/2000 Lei et al.
6,086,677 A 7/2000 Umotoy et al.
6,099,302 A 8/2000 Hong et al.
6,122,036 A 9/2000 Yamasaki et al.
6,124,600 A 9/2000 Moroishi et al.
6,125,789 A 10/2000 Gupta et al.
6,129,044 A 10/2000 Zhao et al.
6,134,807 A 10/2000 Komino
6,137,240 A 10/2000 Bogdan et al.
6,140,252 A 10/2000 Cho et al.
6,148,761 A 11/2000 Majewski et al.
6,160,244 A 12/2000 Ohashi
6,161,500 A 12/2000 Kopacz et al.
6,162,323 A 12/2000 Koshimizu et al.
6,180,979 B1 1/2001 Hofman et al.
6,187,691 B1 2/2001 Fukuda
6,190,634 B1 2/2001 Lieber
6,194,037 B1 2/2001 Terasaki et al.
6,201,999 B1 3/2001 Jevtic
6,204,206 B1 3/2001 Hurley
6,207,932 B1 3/2001 Yoo
6,212,789 B1 4/2001 Kato
6,250,250 B1 6/2001 Maishev et al.
6,271,148 B1 8/2001 Kao
6,274,878 B1 8/2001 Li et al.
6,287,965 B1 9/2001 Kang et al.
D449,873 S 10/2001 Bronson
6,296,909 B1 10/2001 Spitsberg
6,299,133 B2 10/2001 Waragai et al.
6,302,964 B1 10/2001 Umotoy et al.
6,303,523 B2 10/2001 Cheung
6,305,898 B1 10/2001 Yamagishi et al.
6,312,525 B1 11/2001 Bright et al.
6,315,512 B1 11/2001 Tabrizi et al.
D451,893 S 12/2001 Robson
D452,220 S 12/2001 Robson
6,325,858 B1 12/2001 Wengert
6,326,597 B1 12/2001 Lubomirsky et al.
6,329,297 B1 12/2001 Balish
6,342,427 B1 1/2002 Choi et al.
6,347,636 B1 2/2002 Xia
6,352,945 B1 3/2002 Matsuki
6,367,410 B1 4/2002 Leahey et al.
6,368,987 B1 4/2002 Kopacz et al.
6,370,796 B1 4/2002 Zucker
6,372,583 B1 4/2002 Tyagi
6,374,831 B1 4/2002 Chandran
6,375,312 B1 4/2002 Ikeda et al.
D457,609 S 5/2002 Piano
6,383,566 B1 5/2002 Zagdoun
6,383,955 B1 5/2002 Matsuki
6,387,207 B1 5/2002 Janakiraman
6,391,803 B1 5/2002 Kim et al.
6,398,184 B1 6/2002 Sowada et al.
6,410,459 B2 6/2002 Blalock et al.
6,413,321 B1 7/2002 Kim et al.
6,413,583 B1 7/2002 Moghadam et al.
6,420,279 B1 7/2002 Ono et al.
D461,233 S 8/2002 Whalen
D461,882 S 8/2002 Piano
6,435,798 B1 8/2002 Satoh
6,436,819 B1 8/2002 Zhang
6,437,444 B2 8/2002 Andideh
6,445,574 B1 9/2002 Saw et al.
6,446,573 B2 9/2002 Hirayama et al.
6,448,192 B1 9/2002 Kaushik
6,450,757 B1 9/2002 Saeki
6,454,860 B2 9/2002 Metzner et al.
6,455,445 B2 9/2002 Matsuki
6,461,435 B1 10/2002 Littau et al.
6,468,924 B2 10/2002 Lee
6,472,266 B1 10/2002 Yu et al.
6,475,276 B1 11/2002 Elers et al.
6,475,930 B1 11/2002 Junker et al.
6,478,872 B1 11/2002 Chae et al.
6,482,331 B2 11/2002 Lu et al.
6,482,663 B1 11/2002 Buckland
6,483,989 B1 11/2002 Okada et al.
6,499,533 B2 12/2002 Yamada
6,503,562 B1 1/2003 Saito et al.
6,503,826 B1 1/2003 Oda
6,511,539 B1 1/2003 Raaijmakers
6,521,295 B1 2/2003 Remington
6,521,547 B1 2/2003 Chang et al.
6,528,430 B2 3/2003 Kwan
6,528,767 B2 3/2003 Bagley et al.
6,531,193 B2 3/2003 Fonash et al.
6,531,412 B2 3/2003 Conti et al.
6,534,395 B2 3/2003 Werkhoven et al.
6,552,209 B1 4/2003 Lei et al.
6,569,239 B2 5/2003 Arai et al.
6,573,030 B1 6/2003 Fairbairn et al.
6,576,062 B2 6/2003 Matsuse
6,576,064 B2 6/2003 Griffiths et al.
6,576,300 B1 6/2003 Berry et al.
6,578,589 B1 6/2003 Mayusumi
6,579,833 B1 6/2003 McNallan et al.
6,583,048 B1 6/2003 Vincent et al.
6,590,251 B2 7/2003 Kang et al.
6,594,550 B1 7/2003 Okrah
6,598,559 B1 7/2003 Vellore et al.
6,627,503 B2 9/2003 Ma et al.
6,632,478 B2 10/2003 Gaillard et al.
6,633,364 B2 10/2003 Hayashi
6,635,117 B1 10/2003 Kinnard et al.
6,638,839 B2 10/2003 Deng et al.
6,645,304 B2 11/2003 Yamaguchi
6,648,974 B1 11/2003 Ogliari et al.
6,649,921 B1 11/2003 Cekic et al.
6,652,924 B2 11/2003 Sherman
6,656,281 B1 12/2003 Ueda
6,673,196 B1 1/2004 Oyabu
6,682,973 B1 1/2004 Paton et al.
D486,891 S 2/2004 Cronce
6,688,784 B1 2/2004 Templeton
6,689,220 B1 2/2004 Nguyen
6,692,575 B1 2/2004 Omstead et al.
6,692,576 B2 2/2004 Halpin et al.
6,699,003 B2 3/2004 Saeki
6,709,989 B2 3/2004 Ramdani et al.
6,710,364 B2 3/2004 Guldi et al.
6,713,824 B1 3/2004 Mikata
6,716,571 B2 4/2004 Gabriel
6,730,614 B1 5/2004 Lim et al.
6,734,090 B2 5/2004 Agarwala et al.
6,740,853 B1 5/2004 Johnson et al.
6,743,475 B2 6/2004 Skarp et al.
6,743,738 B2 6/2004 Todd et al.

(56) References Cited

U.S. PATENT DOCUMENTS 6,753,507 B2 6/2004 Fure et al.
6,756,318 B2 6/2004 Nguyen et al.
6,759,098 B2 7/2004 Han
6,760,981 B2 7/2004 Leap
6,784,108 B1 8/2004 Donohoe et al.
6,809,005 B2 10/2004 Ranade et al.
6,815,350 B2 11/2004 Kim et al.
6,820,570 B2 11/2004 Kilpela et al.
6,821,910 B2 11/2004 Adomaitis et al.
6,824,665 B2 11/2004 Shelnut et al.
6,825,134 B2 11/2004 Law et al.
6,835,039 B2 12/2004 Van Den Berg
6,846,515 B2 1/2005 Vrtis
6,847,014 B1 1/2005 Benjamin et al.
6,858,524 B2 2/2005 Haukka et al.
6,858,547 B2 2/2005 Metzner
6,861,334 B2 3/2005 Raaijmakers et al.
6,863,019 B2 3/2005 Shamouilian
6,864,041 B2 3/2005 Brown
6,872,258 B2 3/2005 Park et al.
6,872,259 B2 3/2005 Strang
6,874,247 B1 4/2005 Hsu
6,874,480 B1 4/2005 Ismailov
6,875,677 B1 4/2005 Conley, Jr. et al.
6,876,017 B2 4/2005 Goodner
6,884,066 B2 4/2005 Nguyen et al.
6,884,319 B2 4/2005 Kim
6,889,864 B2 5/2005 Lindfors et al.
6,895,158 B2 5/2005 Aylward et al.
6,899,507 B2 5/2005 Yamagishi et al.
6,909,839 B2 6/2005 Wang et al.
6,911,092 B2 6/2005 Sneh
6,913,796 B2 7/2005 Albano et al.
6,930,059 B2 8/2005 Conley, Jr. et al.
6,935,269 B2 8/2005 Lee et al.
6,939,817 B2 9/2005 Sandhu et al.
6,951,587 B1 10/2005 Narushima
6,953,609 B2 10/2005 Carollo
6,955,836 B2 10/2005 Kumagai et al.
6,972,478 B1 12/2005 Waite et al.
6,974,781 B2 12/2005 Timmermans et al.
6,976,822 B2 12/2005 Woodruff
6,984,595 B1 1/2006 Yamazaki
6,990,430 B2 1/2006 Hosek
7,005,391 B2 2/2006 Min
7,021,881 B2 4/2006 Yamagishi
7,045,430 B2 5/2006 Ahn et al.
7,049,247 B2 5/2006 Gates et al.
7,053,009 B2 5/2006 Conley, Jr. et al.
7,055,875 B2 6/2006 Bonora
7,071,051 B1 7/2006 Jeon et al.
7,084,079 B2 8/2006 Conti et al.
7,087,536 B2 8/2006 Nemani et al.
7,088,003 B2 8/2006 Gates et al.
7,092,287 B2 8/2006 Beulens et al.
7,098,149 B2 8/2006 Lukas et al.
7,109,098 B1 9/2006 Ramaswamy et al.
7,115,838 B2 10/2006 Kurara et al.
7,122,085 B2 10/2006 Shero et al.
7,122,222 B2 10/2006 Xiao et al.
7,129,165 B2 10/2006 Basol et al.
7,132,360 B2 11/2006 Schaeffer et al.
7,135,421 B2 11/2006 Ahn et al.
7,143,897 B1 12/2006 Guzman et al.
7,147,766 B2 12/2006 Uzoh et al.
7,153,542 B2 12/2006 Nguyen et al.
7,157,327 B2 1/2007 Haupt
7,163,721 B2 1/2007 Zhang et al.
7,163,900 B2 1/2007 Weber
7,172,497 B2 2/2007 Basol et al.
7,186,648 B1 3/2007 Rozbicki
7,192,824 B2 3/2007 Ahn et al.
7,192,892 B2 3/2007 Ahn et al.
7,195,693 B2 3/2007 Cowans
7,204,887 B2 4/2007 Kawamura et al.
7,205,246 B2 4/2007 MacNeil et al.
7,205,247 B2 4/2007 Lee et al.
7,207,763 B2 4/2007 Lee
7,208,389 B1 4/2007 Tipton et al.
7,211,524 B2 5/2007 Ryu et al.
7,234,476 B2 6/2007 Arai et al.
7,235,137 B2 6/2007 Kitayama et al.
7,235,482 B2 6/2007 Wu
7,235,501 B2 6/2007 Ahn et al.
7,238,596 B2 7/2007 Kouvetakis et al.
7,265,061 B1 9/2007 Cho et al.
D553,104 S 10/2007 Oohashi et al.
7,288,463 B1 10/2007 Papasouliotis
7,290,813 B2 11/2007 Bonora
7,294,582 B2 11/2007 Haverkort et al.
7,297,641 B2 11/2007 Todd et al.
7,298,009 B2 11/2007 Yan et al.
D557,226 S 12/2007 Uchino et al.
7,307,178 B2 12/2007 Kiyomori et al.
7,312,148 B2 12/2007 Ramaswamy et al.
7,312,162 B2 12/2007 Ramaswamy et al.
7,312,494 B2 12/2007 Ahn et al.
7,323,401 B2 1/2008 Ramaswamy et al.
7,326,657 B2 2/2008 Xia et al.
7,327,948 B1 2/2008 Shrinivasan
7,329,947 B2 2/2008 Adachi et al.
7,335,611 B2 2/2008 Ramaswamy et al.
7,354,847 B2 4/2008 Chan et al.
7,357,138 B2 4/2008 Ji et al.
7,393,418 B2 7/2008 Yokogawa
7,393,736 B2 7/2008 Ahn et al.
7,393,765 B2 7/2008 Hanawa et al.
7,396,491 B2 7/2008 Marking et al.
7,399,388 B2 7/2008 Moghadam et al.
7,402,534 B2 7/2008 Mahajani
7,405,166 B2 7/2008 Liang et al.
7,405,454 B2 7/2008 Ahn et al.
7,414,281 B1 8/2008 Fastow
7,422,775 B2 9/2008 Ramaswamy et al.
7,429,532 B2 9/2008 Ramaswamy et al.
7,431,966 B2 10/2008 Derderian et al.
7,437,060 B2 10/2008 Wang et al.
7,442,275 B2 10/2008 Cowans
7,476,291 B2 1/2009 Wang et al.
7,479,198 B2 1/2009 Guffrey
D585,968 S 2/2009 Elkins et al.
7,489,389 B2 2/2009 Shibazaki et al.
7,494,882 B2 2/2009 Vitale
7,498,242 B2 3/2009 Kumar et al.
7,501,292 B2 3/2009 Matsushita et al.
7,503,980 B2 3/2009 Kida et al.
7,514,375 B1 4/2009 Shanker et al.
D593,969 S 6/2009 Li
7,541,297 B2 6/2009 Mallick et al.
7,547,363 B2 6/2009 Tomiyasu et al.
7,566,891 B2 7/2009 Rocha-Alvarez et al.
7,575,968 B2 8/2009 Sadaka et al.
7,579,785 B2 8/2009 Shinmen et al.
7,582,555 B1 9/2009 Lang
7,589,003 B2 9/2009 Kouvetakis et al.
7,589,029 B2 9/2009 Derderian et al.
D602,575 S 10/2009 Breda
7,601,223 B2 10/2009 Lindfors et al.
7,601,225 B2 10/2009 Tuominen et al.
7,611,751 B2 11/2009 Elers
7,611,980 B2 11/2009 Wells et al.
7,618,226 B2 11/2009 Takizawa
7,629,277 B2 12/2009 Ghatnagar
7,632,549 B2 12/2009 Goundar
7,640,142 B2 12/2009 Tachikawa et al.
7,651,583 B2 1/2010 Kent et al.
7,651,961 B2 1/2010 Clark
D609,655 S 2/2010 Sugimoto
7,678,197 B2 3/2010 Maki
7,678,715 B2 3/2010 Mungekar et al.
7,682,454 B2 3/2010 Sneh
7,682,657 B2 3/2010 Sherman
D613,829 S 4/2010 Griffin et al.
D614,153 S 4/2010 Fondurulia et al.

(56) References Cited

U.S. PATENT DOCUMENTS

D614,267 S 4/2010 Breda
D614,268 S 4/2010 Breda
7,690,881 B2 4/2010 Yamagishi
7,691,205 B2 4/2010 Ikedo
7,713,874 B2 5/2010 Milligan
7,720,560 B2 5/2010 Menser et al.
7,723,648 B2 5/2010 Tsukamoto et al.
7,727,864 B2 6/2010 Elers
7,732,343 B2 6/2010 Niroomand et al.
7,740,705 B2 6/2010 Li
7,754,621 B2 7/2010 Putjkonen
7,767,262 B2 8/2010 Clark
7,780,440 B2 8/2010 Shibagaki et al.
7,789,965 B2 9/2010 Matsushita et al.
7,790,633 B1 9/2010 Tarafdar et al.
7,803,722 B2 9/2010 Liang
7,807,578 B2 10/2010 Bencher et al.
7,816,278 B2 10/2010 Reed et al.
7,824,492 B2 11/2010 Tois et al.
7,825,040 B1 11/2010 Fukazawa et al.
7,833,353 B2 11/2010 Furukawahara et al.
7,838,084 B2 11/2010 Derderian et al.
7,842,518 B2 11/2010 Miyajima
7,842,622 B1 11/2010 Lee et al.
D629,874 S 12/2010 Hermans
7,851,019 B2 12/2010 Tuominen et al.
7,851,232 B2 12/2010 van Schravendijk et al.
7,865,070 B2 1/2011 Nakamura
7,884,918 B2 2/2011 Hattori
7,888,233 B1 2/2011 Gauri
D634,719 S 3/2011 Yasuda et al.
7,897,215 B1 3/2011 Fair et al.
7,902,582 B2 3/2011 Forbes et al.
7,910,288 B2 3/2011 Abatchev et al.
7,915,139 B1 3/2011 Lang
7,919,416 B2 4/2011 Lee et al.
7,925,378 B2 4/2011 Gilchrist et al.
7,935,940 B1 5/2011 Smargiassi
7,939,447 B2 5/2011 Bauer et al.
7,955,516 B2 6/2011 Chandrachood
7,963,736 B2 6/2011 Takizawa et al.
7,972,980 B2 7/2011 Lee et al.
7,981,751 B2 7/2011 Zhu et al.
D643,055 S 8/2011 Takahashi
7,992,318 B2 8/2011 Kawaji
7,994,721 B2 8/2011 Espiau et al.
7,998,875 B2 8/2011 DeYoung
8,003,174 B2 8/2011 Fukazawa
8,004,198 B2 8/2011 Bakre et al.
8,020,315 B2 9/2011 Nishimura
8,030,129 B2 10/2011 Jeong
8,038,835 B2 10/2011 Hayashi et al.
8,041,197 B2 10/2011 Kasai et al.
8,041,450 B2 10/2011 Takizawa et al.
8,043,972 B1 10/2011 Liu et al.
8,055,378 B2 11/2011 Numakura
8,060,252 B2 11/2011 Gage et al.
8,071,451 B2 12/2011 Berry
8,071,452 B2 12/2011 Raisanen
8,072,578 B2 12/2011 Yasuda et al.
8,076,230 B2 12/2011 Wei
8,076,237 B2 12/2011 Uzoh
8,076,251 B2 12/2011 Akae et al.
8,082,946 B2 12/2011 Laverdiere et al.
D652,896 S 1/2012 Gether
8,092,604 B2 1/2012 Tomiyasu et al.
D653,734 S 2/2012 Sisk
D655,055 S 2/2012 Toll
8,119,466 B2 2/2012 Avouris
8,137,462 B2 3/2012 Fondurulia et al.
8,137,465 B1 3/2012 Shrinivasan et al.
8,138,676 B2 3/2012 Mills
8,142,862 B2 3/2012 Lee et al.
8,143,174 B2 3/2012 Xia et al.
8,147,242 B2 4/2012 Shibagaki et al.
8,173,554 B2 5/2012 Lee et al.
8,187,951 B1 5/2012 Wang
8,192,901 B2 6/2012 Kageyama
8,196,234 B2 6/2012 Glunk
8,197,915 B2 6/2012 Oka et al.
8,216,380 B2 7/2012 White et al.
8,231,799 B2 7/2012 Bera et al.
D665,055 S 8/2012 Yanagisawa et al.
8,241,991 B2 8/2012 Hsieh et al.
8,242,031 B2 8/2012 Mallick et al.
8,252,114 B2 8/2012 Vukovic
8,252,659 B2 8/2012 Huyghabaert et al.
8,252,691 B2 8/2012 Beynet et al.
8,267,633 B2 9/2012 Obikane
8,272,516 B2 9/2012 Salvador
8,278,176 B2 10/2012 Bauer et al.
8,282,769 B2 10/2012 Iizuka
8,287,648 B2 10/2012 Reed et al.
8,293,016 B2 10/2012 Bahng et al.
8,298,951 B1 10/2012 Nakano
8,307,472 B1 11/2012 Saxon et al.
8,309,173 B2 11/2012 Tuominen et al.
8,323,413 B2 12/2012 Son
8,329,599 B2 12/2012 Fukazawa et al.
8,334,219 B2 12/2012 Lee et al.
8,367,528 B2 2/2013 Bauer et al.
8,372,204 B2 2/2013 Nakamura et al.
8,393,091 B2 3/2013 Kawamoto
8,394,466 B2 3/2013 Hong et al.
8,415,258 B2 4/2013 Akae
8,415,259 B2 4/2013 Lee et al.
8,440,259 B2 5/2013 Chiang et al.
8,444,120 B2 5/2013 Gregg et al.
8,445,075 B2 5/2013 Xu et al.
8,465,811 B2 6/2013 Ueda
8,466,411 B2 6/2013 Arai
8,470,187 B2 6/2013 Ha
8,484,846 B2 7/2013 Dhindsa
8,492,170 B2 7/2013 Xie et al.
8,496,756 B2 7/2013 Cruse et al.
8,506,713 B2 8/2013 Takagi
8,535,767 B1 9/2013 Kimura
D691,974 S 10/2013 Osada et al.
8,551,892 B2 10/2013 Nakano
8,563,443 B2 10/2013 Fukazawa
8,569,184 B2 10/2013 Oka
8,591,659 B1 11/2013 Fang et al.
8,592,005 B2 11/2013 Ueda
8,608,885 B2 12/2013 Goto et al.
8,617,411 B2 12/2013 Singh
8,633,115 B2 1/2014 Chang et al.
8,647,722 B2 2/2014 Kobayashi et al.
8,664,127 B2 3/2014 Bhatia et al.
8,664,627 B1 3/2014 Ishikawa et al.
8,667,654 B2 3/2014 Gros-Jean
8,668,957 B2 3/2014 Dussarrat et al.
8,669,185 B2 3/2014 Onizawa
8,683,943 B2 4/2014 Onodera et al.
8,711,338 B2 4/2014 Liu et al.
D705,745 S 5/2014 Kurs et al.
8,720,965 B2 5/2014 Hino et al.
8,722,510 B2 5/2014 Watanabe et al.
8,722,546 B2 5/2014 Fukazawa et al.
8,726,837 B2 5/2014 Patalay et al.
8,728,832 B2 5/2014 Raisanen et al.
8,742,668 B2 6/2014 Nakano et al.
8,764,085 B2 7/2014 Urabe
8,784,950 B2 7/2014 Fukazawa et al.
8,784,951 B2 7/2014 Fukazawa et al.
8,785,215 B2 7/2014 Kobayashi et al.
8,790,743 B1 7/2014 Omori et al.
8,802,201 B2 8/2014 Raisanen et al.
8,820,809 B2 9/2014 Ando et al.
8,821,640 B2 9/2014 Cleary et al.
8,841,182 B1 9/2014 Chen et al.
8,845,806 B2 9/2014 Aida et al.
D715,410 S 10/2014 Lohmann
8,864,202 B1 10/2014 Schrameyer
D716,742 S 11/2014 Jang et al.

(56) References Cited

U.S. PATENT DOCUMENTS 8,877,655 B2 11/2014 Shero et al.
8,883,270 B2 11/2014 Shero et al.
8,901,016 B2 12/2014 Ha et al.
8,911,826 B2 12/2014 Adachi et al.
8,912,101 B2 12/2014 Tsuji et al.
D720,838 S 1/2015 Yamagishi et al.
8,933,375 B2 1/2015 Dunn et al.
8,940,646 B1 1/2015 Chandrasekharan
8,945,305 B2 2/2015 Marsh
8,945,339 B2 2/2015 Kakimoto
8,946,830 B2 2/2015 Jung et al.
8,956,983 B2 2/2015 Swaminathan
D724,701 S 3/2015 Yamagishi et al.
8,967,608 B2 3/2015 Mitsumori et al.
8,986,456 B2 3/2015 Fondurulia et al.
8,991,887 B2 3/2015 Shin et al.
8,993,054 B2 3/2015 Jung et al.
D726,884 S 4/2015 Yamagishi et al.
9,005,539 B2 4/2015 Halpin et al.
9,017,481 B1 4/2015 Pettinger et al.
9,018,093 B2 4/2015 Tsuji et al.
9,018,111 B2 4/2015 Milligan et al.
9,021,985 B2 5/2015 Alokozai et al.
9,023,737 B2 5/2015 Beynet et al.
9,023,738 B2 5/2015 Kato et al.
9,029,253 B2 5/2015 Milligan et al.
9,029,272 B1 5/2015 Nakano
D732,644 S 6/2015 Yamagishi et al.
D733,261 S 6/2015 Yamagishi et al.
D733,843 S 7/2015 Yamagishi et al.
9,096,931 B2 8/2015 Yednak et al.
9,117,657 B2 8/2015 Nakano et al.
9,123,510 B2 9/2015 Nakano et al.
9,136,108 B2 9/2015 Matsushita et al.
9,142,393 B2 9/2015 Okabe et al.
9,171,714 B2 10/2015 Mori
9,171,716 B2 10/2015 Fukuda
9,190,263 B2 11/2015 Ishikawa et al.
9,190,264 B2 11/2015 Yuasa et al.
9,196,483 B1 11/2015 Lee et al.
9,202,727 B2 12/2015 Dunn et al.
9,257,274 B2 2/2016 Kang
9,299,595 B2 3/2016 Dunn et al.
9,324,811 B2 4/2016 Weeks
9,341,296 B2 5/2016 Yednak
9,384,987 B2 7/2016 Jung
9,394,608 B2 7/2016 Shero et al.
9,396,934 B2 7/2016 Tolle
9,396,956 B1 7/2016 Fukazawa
9,404,587 B2 8/2016 Shugrue et al.
9,412,564 B2 8/2016 Milligan et al.
9,447,498 B2 9/2016 Shiba
2001/0017103 A1 8/2001 Takeshita et al.
2001/0018267 A1 8/2001 Shinriki et al.
2001/0019777 A1 9/2001 Tanaka et al.
2001/0019900 A1 9/2001 Hasegawa
2001/0028924 A1 10/2001 Sherman
2001/0046765 A1 11/2001 Cappellani et al.
2001/0049202 A1 12/2001 Maeda et al.
2002/0001974 A1 1/2002 Chan
2002/0001976 A1 1/2002 Danek
2002/0011210 A1 1/2002 Satoh et al.
2002/0014204 A1 2/2002 Pyo
2002/0064592 A1 5/2002 Datta et al.
2002/0076507 A1 6/2002 Chiang et al.
2002/0079714 A1 6/2002 Soucy et al.
2002/0088542 A1 7/2002 Nishikawa et al.
2002/0098627 A1 7/2002 Pomarede et al.
2002/0108670 A1 8/2002 Baker et al.
2002/0110991 A1 8/2002 Li
2002/0114886 A1 8/2002 Chou et al.
2002/0115252 A1 8/2002 Haukka et al.
2002/0164420 A1 11/2002 Derderian et al.
2002/0172768 A1 11/2002 Endo et al.
2002/0187650 A1 12/2002 Blalock et al.
2002/0197849 A1 12/2002 Mandal
2003/0003635 A1 1/2003 Paranjpe et al.
2003/0003696 A1 1/2003 Gelatos et al.
2003/0010452 A1 1/2003 Park et al.
2003/0012632 A1 1/2003 Saeki
2003/0015596 A1 1/2003 Evans
2003/0019428 A1 1/2003 Ku et al.
2003/0019580 A1 1/2003 Strang
2003/0025146 A1 2/2003 Narwankar et al.
2003/0040158 A1 2/2003 Saitoh
2003/0042419 A1 3/2003 Katsumata et al.
2003/0049375 A1 3/2003 Nguyen et al.
2003/0054670 A1 3/2003 Wang et al.
2003/0059535 A1 3/2003 Luo et al.
2003/0059980 A1 3/2003 Chen et al.
2003/0066826 A1 4/2003 Lee et al.
2003/0075925 A1 4/2003 Lindfors et al.
2003/0091938 A1 5/2003 Fairbairn et al.
2003/0094133 A1 5/2003 Yoshidome et al.
2003/0111963 A1 6/2003 Tolmachev et al.
2003/0121608 A1 7/2003 Chen
2003/0134038 A1 7/2003 Paranjpe
2003/0141820 A1 7/2003 White et al.
2003/0143328 A1 7/2003 Chen
2003/0157436 A1 8/2003 Manger et al.
2003/0168001 A1 9/2003 Sneh
2003/0170583 A1 9/2003 Nakashima
2003/0180458 A1 9/2003 Sneh
2003/0183156 A1 10/2003 Dando
2003/0192875 A1 10/2003 Bieker et al.
2003/0198587 A1 10/2003 Kaloyeros
2003/0209323 A1 11/2003 Yokogaki
2003/0217915 A1 11/2003 Ouellet
2003/0228772 A1 12/2003 Cowans
2003/0232138 A1 12/2003 Tuominen et al.
2004/0009679 A1 1/2004 Yeo et al.
2004/0013577 A1 1/2004 Ganguli et al.
2004/0013818 A1 1/2004 Moon et al.
2004/0016637 A1 1/2004 Yang
2004/0018307 A1 1/2004 Park et al.
2004/0018750 A1 1/2004 Sophie et al.
2004/0023516 A1 2/2004 Londergan et al.
2004/0029052 A1 2/2004 Park et al.
2004/0036129 A1 2/2004 Forbes et al.
2004/0063289 A1 4/2004 Ohta
2004/0071897 A1 4/2004 Verplancken et al.
2004/0077182 A1 4/2004 Lim et al.
2004/0079960 A1 4/2004 Shakuda
2004/0080697 A1 4/2004 Song
2004/0082171 A1 4/2004 Shin et al.
2004/0094402 A1 5/2004 Gopalraja
2004/0101622 A1 5/2004 Park et al.
2004/0103914 A1 6/2004 Cheng et al.
2004/0106249 A1 6/2004 Huotari
2004/0124131 A1 7/2004 Aitchison
2004/0124549 A1 7/2004 Curran
2004/0134429 A1 7/2004 Yamanaka
2004/0144980 A1 7/2004 Ahn et al.
2004/0146644 A1 7/2004 Xia et al.
2004/0168627 A1 9/2004 Conley et al.
2004/0169032 A1 9/2004 Murayama et al.
2004/0198069 A1 10/2004 Metzner et al.
2004/0200499 A1 10/2004 Harvey et al.
2004/0209477 A1 10/2004 Buxbaum et al.
2004/0211357 A1 10/2004 Gadgil
2004/0212947 A1 10/2004 Nguyen
2004/0214399 A1 10/2004 Ahn et al.
2004/0219793 A1 11/2004 Hishiya et al.
2004/0221807 A1 11/2004 Verghese et al.
2004/0247779 A1 12/2004 Selvamanickam et al.
2004/0261712 A1 12/2004 Hayashi et al.
2004/0266011 A1 12/2004 Lee et al.
2005/0008799 A1 1/2005 Tomiyasu et al.
2005/0019026 A1 1/2005 Wang et al.
2005/0020071 A1 1/2005 Sonobe et al.
2005/0023624 A1 2/2005 Ahn et al.
2005/0034674 A1 2/2005 Ono
2005/0037154 A1 2/2005 Koh et al.
2005/0037610 A1 2/2005 Cha

(56) References Cited

U.S. PATENT DOCUMENTS

2005/0051093 A1 3/2005 Makino et al.
2005/0054228 A1 3/2005 March
2005/0059262 A1 3/2005 Yin et al.
2005/0064207 A1 3/2005 Senzaki et al.
2005/0064719 A1 3/2005 Liu
2005/0066893 A1 3/2005 Soininen
2005/0069651 A1 3/2005 Miyoshi
2005/0070123 A1 3/2005 Hirano
2005/0070729 A1 3/2005 Kiyomori et al.
2005/0072357 A1 4/2005 Shero et al.
2005/0074983 A1 4/2005 Shinriki et al.
2005/0092249 A1 5/2005 Kilpela et al.
2005/0095770 A1 5/2005 Kumagai et al.
2005/0100669 A1 5/2005 Kools et al.
2005/0101154 A1 5/2005 Huang
2005/0106893 A1 5/2005 Wilk
2005/0110069 A1 5/2005 Kil et al.
2005/0112282 A1 5/2005 Gordon et al.
2005/0120805 A1 6/2005 Lane
2005/0120962 A1 6/2005 Ushioda et al.
2005/0123690 A1 6/2005 Derderian et al.
2005/0133161 A1 6/2005 Carpenter et al.
2005/0142361 A1 6/2005 Nakanishi
2005/0145338 A1 7/2005 Park et al.
2005/0153571 A1 7/2005 Senzaki
2005/0173003 A1 8/2005 Laverdiere et al.
2005/0175789 A1 8/2005 Helms
2005/0181535 A1 8/2005 Yun et al.
2005/0187647 A1 8/2005 Wang et al.
2005/0191828 A1 9/2005 Al-Bayati et al.
2005/0208718 A1 9/2005 Lim et al.
2005/0212119 A1 9/2005 Shero
2005/0214457 A1 9/2005 Schmitt et al.
2005/0214458 A1 9/2005 Meiere
2005/0218462 A1 10/2005 Ahn et al.
2005/0221618 A1 10/2005 AmRhein et al.
2005/0223994 A1 10/2005 Blomiley et al.
2005/0227502 A1 10/2005 Schmitt et al.
2005/0229848 A1 10/2005 Shinriki
2005/0229972 A1 10/2005 Hoshi et al.
2005/0241176 A1 11/2005 Shero et al.
2005/0241763 A1 11/2005 Huang et al.
2005/0251990 A1 11/2005 Choi
2005/0255257 A1 11/2005 Choi et al.
2005/0258280 A1 11/2005 Goto et al.
2005/0260347 A1 11/2005 Narwankar et al.
2005/0260850 A1 11/2005 Loke
2005/0263075 A1 12/2005 Wang et al.
2005/0263932 A1 12/2005 Heugel
2005/0271813 A1 12/2005 Kher et al.
2005/0274323 A1 12/2005 Seidel et al.
2005/0282101 A1 12/2005 Adachi
2005/0287725 A1 12/2005 Kitagawa
2005/0287771 A1 12/2005 Seamons et al.
2006/0013946 A1 1/2006 Park et al.
2006/0014384 A1 1/2006 Lee et al.
2006/0014397 A1 1/2006 Seamons et al.
2006/0016783 A1 1/2006 Wu et al.
2006/0019033 A1 1/2006 Muthukrishnan et al.
2006/0019502 A1 1/2006 Park et al.
2006/0021703 A1 2/2006 Umotoy et al.
2006/0024439 A2 2/2006 Tuominen et al.
2006/0046518 A1 3/2006 Hill et al.
2006/0051520 A1 3/2006 Behle et al.
2006/0051925 A1 3/2006 Ahn et al.
2006/0060930 A1 3/2006 Metz et al.
2006/0062910 A1 3/2006 Meiere
2006/0063346 A1 3/2006 Lee et al.
2006/0068121 A1 3/2006 Lee et al.
2006/0068125 A1 3/2006 Radhakrishnan
2006/0087638 A1 4/2006 Hirayanagi
2006/0105566 A1 5/2006 Waldfried et al.
2006/0107898 A1 5/2006 Blomberg
2006/0110934 A1 5/2006 Fukuchi
2006/0113675 A1 6/2006 Chang et al.
2006/0113806 A1 6/2006 Tsuji et al.
2006/0128168 A1 6/2006 Ahn et al.
2006/0130767 A1 6/2006 Herchen
2006/0137609 A1 6/2006 Puchacz et al.
2006/0147626 A1 7/2006 Blomberg
2006/0148180 A1 7/2006 Ahn et al.
2006/0163612 A1 7/2006 Kouvetakis et al.
2006/0172531 A1 8/2006 Lin et al.
2006/0177855 A1 8/2006 Utermohlen
2006/0191555 A1 8/2006 Yoshida et al.
2006/0193979 A1 8/2006 Meiere et al.
2006/0199357 A1 9/2006 Wan et al.
2006/0205223 A1 9/2006 Smayling
2006/0208215 A1 9/2006 Metzner et al.
2006/0213439 A1 9/2006 Ishizaka
2006/0223301 A1 10/2006 Vanhaelemeersch et al.
2006/0226117 A1 10/2006 Bertram et al.
2006/0228888 A1 10/2006 Lee et al.
2006/0236934 A1 10/2006 Choi et al.
2006/0240574 A1 10/2006 Yoshie
2006/0240662 A1 10/2006 Conley et al.
2006/0251827 A1 11/2006 Nowak
2006/0257563 A1 11/2006 Doh et al.
2006/0257584 A1 11/2006 Derderian et al.
2006/0258078 A1 11/2006 Lee et al.
2006/0258173 A1 11/2006 Xiao et al.
2006/0260545 A1 11/2006 Ramaswamy et al.
2006/0263522 A1 11/2006 Byun
2006/0264060 A1 11/2006 Ramaswamy et al.
2006/0264066 A1 11/2006 Bartholomew
2006/0266289 A1 11/2006 Verghese et al.
2006/0269692 A1 11/2006 Balseanu
2006/0278524 A1 12/2006 Stowell
2006/0286818 A1 12/2006 Wang et al.
2006/0291982 A1 12/2006 Tanaka
2007/0006806 A1 1/2007 Imai
2007/0010072 A1 1/2007 Bailey et al.
2007/0020953 A1 1/2007 Tsai et al.
2007/0022954 A1 2/2007 Iizuka et al.
2007/0026651 A1 2/2007 Leam et al.
2007/0028842 A1 2/2007 Inagawa et al.
2007/0031598 A1 2/2007 Okuyama et al.
2007/0031599 A1 2/2007 Gschwandtner et al.
2007/0032082 A1 2/2007 Ramaswamy et al.
2007/0037412 A1 2/2007 Dip et al.
2007/0042117 A1 2/2007 Kupurao et al.
2007/0049053 A1 3/2007 Mahajani
2007/0054499 A1 3/2007 Jang
2007/0059948 A1 3/2007 Metzner et al.
2007/0062453 A1 3/2007 Ishikawa
2007/0065578 A1 3/2007 McDougall
2007/0066010 A1 3/2007 Ando
2007/0066079 A1 3/2007 Kloster et al.
2007/0077355 A1 4/2007 Chacin et al.
2007/0082132 A1 4/2007 Shinriki
2007/0084405 A1 4/2007 Kim
2007/0096194 A1 5/2007 Streck et al.
2007/0098527 A1 5/2007 Hall et al.
2007/0107845 A1 5/2007 Ishizawa et al.
2007/0111545 A1 5/2007 Lee et al.
2007/0116873 A1 5/2007 Li et al.
2007/0123037 A1 5/2007 Lee et al.
2007/0125762 A1 6/2007 Cui et al.
2007/0128538 A1 6/2007 Fairbairn et al.
2007/0134942 A1 6/2007 Ahn et al.
2007/0146621 A1 6/2007 Yeom
2007/0148990 A1 6/2007 Deboer et al.
2007/0155138 A1 7/2007 Tomasini et al.
2007/0158026 A1 7/2007 Amikura
2007/0163440 A1 7/2007 Kim et al.
2007/0166457 A1 7/2007 Yamoto et al.
2007/0166966 A1 7/2007 Todd et al.
2007/0166999 A1 7/2007 Vaarstra
2007/0173071 A1 7/2007 Afzali-Ardakani et al.
2007/0175393 A1 8/2007 Nishimura et al.
2007/0175397 A1 8/2007 Tomiyasu et al.
2007/0186952 A1 8/2007 Honda et al.
2007/0207275 A1 9/2007 Nowak et al.
2007/0209590 A1 9/2007 Li

(56) References Cited

U.S. PATENT DOCUMENTS

2007/0210890 A1 9/2007 Hsu et al.
2007/0215048 A1 9/2007 Suzuki et al.
2007/0218200 A1 9/2007 Suzuki et al.
2007/0218705 A1 9/2007 Matsuki et al.
2007/0224777 A1 9/2007 Hamelin
2007/0224833 A1 9/2007 Morisada et al.
2007/0232031 A1 10/2007 Singh et al.
2007/0232071 A1 10/2007 Balseanu et al.
2007/0232501 A1 10/2007 Tonomura
2007/0234955 A1 10/2007 Suzuki et al.
2007/0237697 A1 10/2007 Clark
2007/0237699 A1 10/2007 Clark
2007/0241688 A1 10/2007 DeVincentis et al.
2007/0248767 A1 10/2007 Okura et al.
2007/0249131 A1 10/2007 Allen et al.
2007/0251444 A1 11/2007 Gros-Jean et al.
2007/0252244 A1 11/2007 Srividya et al.
2007/0252532 A1 11/2007 DeVancentis et al.
2007/0264807 A1 11/2007 Leone et al.
2007/0275166 A1 11/2007 Thridandam et al.
2007/0277735 A1 12/2007 Mokhesi et al.
2007/0281496 A1 12/2007 Ingle et al.
2007/0298362 A1 12/2007 Rocha-Alvarez et al.
2008/0003824 A1 1/2008 Padhi et al.
2008/0003838 A1 1/2008 Haukka et al.
2008/0006208 A1 1/2008 Ueno et al.
2008/0018004 A1 1/2008 Steidl
2008/0023436 A1 1/2008 Gros-Jean et al.
2008/0026574 A1 1/2008 Brcka
2008/0026597 A1 1/2008 Munro et al.
2008/0029790 A1 2/2008 Ahn et al.
2008/0036354 A1 2/2008 Letz et al.
2008/0038485 A1 2/2008 Fukazawa et al.
2008/0054332 A1 3/2008 Kim et al.
2008/0054813 A1 3/2008 Espiau et al.
2008/0057659 A1 3/2008 Forbes et al.
2008/0061667 A1 3/2008 Gaertner et al.
2008/0066778 A1 3/2008 Matsushita et al.
2008/0069955 A1 3/2008 Hong et al.
2008/0075881 A1 3/2008 Won et al.
2008/0076266 A1 3/2008 Fukazawa et al.
2008/0081104 A1 4/2008 Hasebe et al.
2008/0081113 A1 4/2008 Clark
2008/0081121 A1 4/2008 Morita et al.
2008/0085226 A1 4/2008 Fondurulia et al.
2008/0092815 A1 4/2008 Chen et al.
2008/0102203 A1 5/2008 Wu
2008/0113094 A1 5/2008 Casper
2008/0113096 A1 5/2008 Mahajani
2008/0113097 A1 5/2008 Mahajani et al.
2008/0124197 A1 5/2008 van der Meulen et al.
2008/0124908 A1 5/2008 Forbes et al.
2008/0133154 A1 6/2008 Krauss et al.
2008/0142483 A1 6/2008 Hua
2008/0149031 A1 6/2008 Chu et al.
2008/0152463 A1 6/2008 Chidambaram et al.
2008/0153311 A1 6/2008 Padhi et al.
2008/0173240 A1 7/2008 Furukawahara
2008/0173326 A1 7/2008 Gu et al.
2008/0176375 A1 7/2008 Erben et al.
2008/0179104 A1 7/2008 Zhang
2008/0182075 A1 7/2008 Chopra
2008/0182390 A1 7/2008 Lemmi et al.
2008/0191193 A1 8/2008 Li et al.
2008/0199977 A1 8/2008 Weigel et al.
2008/0202416 A1 8/2008 Provencher
2008/0203487 A1 8/2008 Hohage et al.
2008/0211423 A1 9/2008 Shinmen et al.
2008/0211526 A1 9/2008 Shinma
2008/0216077 A1 9/2008 Emani et al.
2008/0224240 A1 9/2008 Ahn et al.
2008/0233288 A1 9/2008 Clark
2008/0237572 A1 10/2008 Chui et al.
2008/0241384 A1 10/2008 Jeong
2008/0242097 A1 10/2008 Boescke et al.
2008/0242116 A1 10/2008 Clark
2008/0248310 A1 10/2008 Kim et al.
2008/0257494 A1 10/2008 Hayashi et al.
2008/0261413 A1 10/2008 Mahajani
2008/0264337 A1 10/2008 Sano et al.
2008/0267598 A1 10/2008 Nakamura
2008/0277715 A1 11/2008 Ohmi et al.
2008/0282970 A1 11/2008 Heys et al.
2008/0295872 A1 12/2008 Riker et al.
2008/0298945 A1 12/2008 Cox
2008/0299326 A1 12/2008 Fukazawa
2008/0302303 A1 12/2008 Choi et al.
2008/0305246 A1 12/2008 Choi et al.
2008/0305443 A1 12/2008 Nakamura
2008/0315292 A1 12/2008 Ji et al.
2008/0317972 A1 12/2008 Hendriks
2009/0000550 A1 1/2009 Tran et al.
2009/0000551 A1 1/2009 Choi et al.
2009/0011608 A1 1/2009 Nabatame
2009/0020072 A1 1/2009 Mizunaga et al.
2009/0023229 A1 1/2009 Matsushita
2009/0029503 A1 1/2009 Arai
2009/0029528 A1 1/2009 Sanchez et al.
2009/0029564 A1 1/2009 Yamashita et al.
2009/0033907 A1 2/2009 Watson
2009/0035947 A1 2/2009 Horii
2009/0041952 A1 2/2009 Yoon et al.
2009/0041984 A1 2/2009 Mayers et al.
2009/0042344 A1 2/2009 Ye et al.
2009/0045829 A1 2/2009 Awazu
2009/0050621 A1 2/2009 Awazu
2009/0061644 A1 3/2009 Chiang et al.
2009/0061647 A1 3/2009 Mallick et al.
2009/0085156 A1 4/2009 Dewey et al.
2009/0090382 A1 4/2009 Morisada
2009/0093094 A1 4/2009 Ye et al.
2009/0095221 A1 4/2009 Tam et al.
2009/0107404 A1 4/2009 Ogliari et al.
2009/0122293 A1 5/2009 Shibazaki
2009/0130331 A1 5/2009 Asai
2009/0136668 A1 5/2009 Gregg et al.
2009/0136683 A1 5/2009 Fukasawa et al.
2009/0139657 A1 6/2009 Lee et al.
2009/0142935 A1 6/2009 Fukuzawa et al.
2009/0146322 A1 6/2009 Weling et al.
2009/0156015 A1 6/2009 Park et al.
2009/0206056 A1 8/2009 Xu
2009/0209081 A1 8/2009 Matero
2009/0211523 A1 8/2009 Kuppurao et al.
2009/0211525 A1 8/2009 Sarigiannis et al.
2009/0236014 A1 9/2009 Wilson
2009/0239386 A1 9/2009 Suzaki et al.
2009/0242957 A1 10/2009 Ma et al.
2009/0246374 A1 10/2009 Vukovic
2009/0246399 A1 10/2009 Goundar
2009/0250955 A1 10/2009 Aoki
2009/0261331 A1 10/2009 Yang et al.
2009/0269506 A1 10/2009 Okura et al.
2009/0269941 A1 10/2009 Raisanen
2009/0275205 A1 11/2009 Kiehlbauch et al.
2009/0277510 A1 11/2009 Shikata
2009/0283041 A1 11/2009 Tomiyasu et al.
2009/0283217 A1 11/2009 Lubomirsky et al.
2009/0286400 A1 11/2009 Heo et al.
2009/0286402 A1 11/2009 Xia et al.
2009/0289300 A1 11/2009 Sasaki et al.
2009/0304558 A1 12/2009 Patton
2009/0311857 A1 12/2009 Todd et al.
2010/0001409 A1 1/2010 Humbert et al.
2010/0006031 A1 1/2010 Choi et al.
2010/0014479 A1 1/2010 Kim
2010/0015813 A1 1/2010 McGinnis et al.
2010/0024727 A1 2/2010 Kim et al.
2010/0025796 A1 2/2010 Dabiran
2010/0041179 A1 2/2010 Lee
2010/0041243 A1 2/2010 Cheng et al.
2010/0055312 A1 3/2010 Kato et al.
2010/0055442 A1 3/2010 Kellock
2010/0075507 A1 3/2010 Chang et al.

(56) References Cited

U.S. PATENT DOCUMENTS

2010/0089320 A1 4/2010 Kim
2010/0090149 A1 4/2010 Thompson et al.
2010/0092696 A1 4/2010 Shinriki
2010/0093187 A1 4/2010 Lee et al.
2010/0102417 A1 4/2010 Ganguli et al.
2010/0116209 A1 5/2010 Kato
2010/0124610 A1 5/2010 Aikawa et al.
2010/0124618 A1 5/2010 Kobayashi et al.
2010/0124621 A1 5/2010 Kobayashi et al.
2010/0126605 A1 5/2010 Stones
2010/0130017 A1 5/2010 Luo et al.
2010/0134023 A1 6/2010 Mills
2010/0136216 A1 6/2010 Tsuei et al.
2010/0140221 A1 6/2010 Kikuchi et al.
2010/0144162 A1 6/2010 Lee et al.
2010/0151206 A1 6/2010 Wu et al.
2010/0159638 A1 6/2010 Jeong
2010/0162752 A1 7/2010 Tabata et al.
2010/0170441 A1 7/2010 Won et al.
2010/0178137 A1 7/2010 Chintalapati et al.
2010/0178423 A1 7/2010 Shimizu et al.
2010/0184302 A1 7/2010 Lee et al.
2010/0193501 A1 8/2010 Zucker et al.
2010/0195392 A1 8/2010 Freeman
2010/0221452 A1 9/2010 Kang
2010/0230051 A1 9/2010 Iizuka
2010/0233886 A1 9/2010 Yang et al.
2010/0243166 A1 9/2010 Hayashi et al.
2010/0244688 A1 9/2010 Braun et al.
2010/0255198 A1 10/2010 Cleary et al.
2010/0255625 A1 10/2010 De Vries
2010/0255658 A1 10/2010 Aggarwal
2010/0259152 A1 10/2010 Yasuda et al.
2010/0270675 A1 10/2010 Harada
2010/0275846 A1 11/2010 Kitagawa
2010/0282645 A1 11/2010 Wang
2010/0285319 A1 11/2010 Kwak et al.
2010/0294199 A1 11/2010 Tran et al.
2010/0301752 A1 12/2010 Bakre et al.
2010/0304047 A1 12/2010 Yang et al.
2010/0307415 A1 12/2010 Shero et al.
2010/0317198 A1 12/2010 Antonelli
2010/0322604 A1 12/2010 Fondurulia et al.
2011/0000619 A1 1/2011 Suh
2011/0006402 A1 1/2011 Zhou
2011/0006406 A1 1/2011 Urbanowicz et al.
2011/0014795 A1 1/2011 Lee
2011/0027999 A1 2/2011 Sparks et al.
2011/0034039 A1 2/2011 Liang et al.
2011/0048642 A1 3/2011 Mihara et al.
2011/0052833 A1 3/2011 Hanawa et al.
2011/0056513 A1 3/2011 Hombach et al.
2011/0056626 A1 3/2011 Brown et al.
2011/0061810 A1 3/2011 Ganguly et al.
2011/0070380 A1 3/2011 Shero et al.
2011/0081519 A1 4/2011 Dillingh
2011/0086516 A1 4/2011 Lee et al.
2011/0089469 A1 4/2011 Merckling
2011/0097901 A1 4/2011 Banna et al.
2011/0107512 A1 5/2011 Gilbert
2011/0108194 A1 5/2011 Yoshioka et al.
2011/0108741 A1 5/2011 Ingram
2011/0108929 A1 5/2011 Meng
2011/0117490 A1 5/2011 Bae et al.
2011/0117737 A1 5/2011 Agarwala et al.
2011/0117749 A1 5/2011 Sheu
2011/0124196 A1 5/2011 Lee
2011/0139748 A1 6/2011 Donnelly et al.
2011/0143032 A1 6/2011 Vrtis et al.
2011/0143461 A1 6/2011 Fish et al.
2011/0159202 A1 6/2011 Matsushita
2011/0159673 A1 6/2011 Hanawa et al.
2011/0175011 A1 7/2011 Ehrne et al.
2011/0183079 A1 7/2011 Jackson et al.
2011/0183269 A1 7/2011 Zhu
2011/0183527 A1 7/2011 Cho
2011/0192820 A1 8/2011 Yeom et al.
2011/0198736 A1 8/2011 Shero et al.
2011/0210468 A1 9/2011 Shannon et al.
2011/0220874 A1 9/2011 Hanrath
2011/0236600 A1 9/2011 Fox et al.
2011/0239936 A1 10/2011 Suzaki et al.
2011/0254052 A1 10/2011 Kouvetakis
2011/0256675 A1 10/2011 Avouris
2011/0256726 A1 10/2011 LaVoie
2011/0256727 A1 10/2011 Beynet et al.
2011/0256734 A1 10/2011 Hausmann et al.
2011/0265549 A1 11/2011 Cruse et al.
2011/0265715 A1 11/2011 Keller
2011/0265725 A1 11/2011 Tsuji
2011/0265951 A1 11/2011 Xu et al.
2011/0275166 A1 11/2011 Shero et al.
2011/0281417 A1 11/2011 Gordon et al.
2011/0283933 A1 11/2011 Makarov et al.
2011/0294075 A1 12/2011 Chen et al.
2011/0308460 A1 12/2011 Hong et al.
2012/0003500 A1 1/2012 Yoshida et al.
2012/0006489 A1 1/2012 Okita
2012/0024479 A1 2/2012 Palagashvili et al.
2012/0032311 A1 2/2012 Gates
2012/0043556 A1 2/2012 Dube et al.
2012/0052681 A1 3/2012 Marsh
2012/0070136 A1 3/2012 Koelmel et al.
2012/0070997 A1 3/2012 Larson
2012/0090704 A1 4/2012 Laverdiere et al.
2012/0098107 A1 4/2012 Raisanen et al.
2012/0100464 A1 4/2012 Kageyama
2012/0103264 A1 5/2012 Choi et al.
2012/0103939 A1 5/2012 Wu et al.
2012/0107607 A1 5/2012 Takaki et al.
2012/0114877 A1 5/2012 Lee
2012/0121823 A1 5/2012 Chhabra
2012/0128897 A1 5/2012 Xiao et al.
2012/0135145 A1 5/2012 Je et al.
2012/0156108 A1 6/2012 Fondurulia et al.
2012/0160172 A1 6/2012 Wamura et al.
2012/0164327 A1 6/2012 Sato
2012/0164837 A1 6/2012 Tan et al.
2012/0164842 A1 6/2012 Watanabe
2012/0171391 A1 7/2012 Won
2012/0171874 A1 7/2012 Thridandam et al.
2012/0207456 A1 8/2012 Kim et al.
2012/0212121 A1 8/2012 Lin
2012/0214318 A1 8/2012 Fukazawa et al.
2012/0220139 A1 8/2012 Lee et al.
2012/0225561 A1 9/2012 Watanabe
2012/0240858 A1 9/2012 Taniyama et al.
2012/0263876 A1 10/2012 Haukka et al.
2012/0270339 A1 10/2012 Xie et al.
2012/0270393 A1 10/2012 Pore et al.
2012/0289053 A1 11/2012 Holland et al.
2012/0295427 A1 11/2012 Bauer
2012/0304935 A1 12/2012 Oosterlaken et al.
2012/0305196 A1 12/2012 Mori et al.
2012/0315113 A1 12/2012 Hiroki
2012/0318334 A1 12/2012 Bedell et al.
2012/0321786 A1 12/2012 Satitpunwaycha et al.
2012/0322252 A1 12/2012 Son et al.
2012/0325148 A1 12/2012 Yamagishi et al.
2012/0328780 A1 12/2012 Yamagishi et al.
2013/0005122 A1 1/2013 Schwarzenbach et al.
2013/0011983 A1 1/2013 Tsai
2013/0014697 A1 1/2013 Kanayama
2013/0014896 A1 1/2013 Shoji et al.
2013/0019944 A1 1/2013 Hekmatshoar-Tabai et al.
2013/0019945 A1 1/2013 Hekmatshoar-Tabai et al.
2013/0023129 A1 1/2013 Reed
2013/0048606 A1 2/2013 Mao et al.
2013/0064973 A1 3/2013 Chen et al.
2013/0068727 A1 3/2013 Okita
2013/0068970 A1 3/2013 Matsushita
2013/0078392 A1 3/2013 Xiao et al.
2013/0081702 A1 4/2013 Mohammed et al.
2013/0084714 A1 4/2013 Oka et al.

(56) References Cited

U.S. PATENT DOCUMENTS

2013/0104988 A1 5/2013 Yednak et al.
2013/0104992 A1 5/2013 Yednak et al.
2013/0105796 A1 5/2013 Liu et al.
2013/0115383 A1 5/2013 Lu et al.
2013/0115763 A1 5/2013 Takamure et al.
2013/0122712 A1 5/2013 Kim et al.
2013/0126515 A1 5/2013 Shero et al.
2013/0129577 A1 5/2013 Halpin et al.
2013/0134148 A1 5/2013 Tachikawa
2013/0160709 A1 6/2013 White
2013/0168354 A1 7/2013 Kanarik
2013/0180448 A1 7/2013 Sakaue et al.
2013/0183814 A1 7/2013 Huang et al.
2013/0203266 A1 8/2013 Hintze
2013/0210241 A1 8/2013 Lavoie et al.
2013/0217239 A1 8/2013 Mallick et al.
2013/0217240 A1 8/2013 Mallick et al.
2013/0217241 A1 8/2013 Underwood et al.
2013/0217243 A1 8/2013 Underwood et al.
2013/0224964 A1 8/2013 Fukazawa
2013/0230814 A1 9/2013 Dunn et al.
2013/0256838 A1 10/2013 Sanchez et al.
2013/0264659 A1 10/2013 Jung
2013/0269612 A1 10/2013 Cheng et al.
2013/0285155 A1 10/2013 Glass
2013/0288480 A1 10/2013 Sanchez et al.
2013/0292047 A1 11/2013 Tian et al.
2013/0292676 A1 11/2013 Milligan et al.
2013/0292807 A1 11/2013 Raisanen et al.
2013/0313656 A1 11/2013 Tong
2013/0319290 A1 12/2013 Xiao et al.
2013/0323435 A1 12/2013 Xiao et al.
2013/0330165 A1 12/2013 Wimplinger
2013/0330911 A1 12/2013 Huang et al.
2013/0330933 A1 12/2013 Fukazawa et al.
2013/0337583 A1 12/2013 Kobayashi et al.
2013/0340619 A1 12/2013 Tammera
2013/0344248 A1 12/2013 Clark
2014/0000843 A1 1/2014 Dunn et al.
2014/0001520 A1 1/2014 Glass
2014/0014642 A1 1/2014 Elliot et al.
2014/0014644 A1 1/2014 Akiba et al.
2014/0020619 A1 1/2014 Vincent et al.
2014/0027884 A1 1/2014 Tang et al.
2014/0036274 A1 2/2014 Marquardt et al.
2014/0048765 A1 2/2014 Ma et al.
2014/0056679 A1 2/2014 Yamabe et al.
2014/0057454 A1 2/2014 Subramonium
2014/0060147 A1 3/2014 Sarin et al.
2014/0062304 A1 3/2014 Nakano et al.
2014/0067110 A1 3/2014 Lawson et al.
2014/0073143 A1 3/2014 Alokozai et al.
2014/0077240 A1 3/2014 Roucka et al.
2014/0084341 A1 3/2014 Weeks
2014/0087544 A1 3/2014 Tolle
2014/0094027 A1 4/2014 Azumo et al.
2014/0096716 A1 4/2014 Chung et al.
2014/0099798 A1 4/2014 Tsuji
2014/0103145 A1 4/2014 White et al.
2014/0110798 A1 4/2014 Cai
2014/0116335 A1 5/2014 Tsuji et al.
2014/0120487 A1 5/2014 Kaneko
2014/0127907 A1 5/2014 Yang
2014/0141625 A1 5/2014 Fukazawa et al.
2014/0159170 A1 6/2014 Raisanen et al.
2014/0174354 A1 6/2014 Arai
2014/0175054 A1 6/2014 Carlson et al.
2014/0179085 A1 6/2014 Hirose et al.
2014/0182053 A1 7/2014 Huang
2014/0217065 A1 8/2014 Winkler et al.
2014/0220247 A1 8/2014 Haukka et al.
2014/0225065 A1 8/2014 Rachmady et al.
2014/0227072 A1 8/2014 Lee et al.
2014/0251953 A1 9/2014 Winkler et al.
2014/0251954 A1 9/2014 Winkler et al.
2014/0256156 A1 9/2014 Harada et al.
2014/0283747 A1 9/2014 Kasai et al.
2014/0346650 A1 11/2014 Raisanen et al.
2014/0349033 A1 11/2014 Nonaka et al.
2014/0363980 A1 12/2014 Kawamata et al.
2014/0363985 A1 12/2014 Jang et al.
2014/0367043 A1 12/2014 Bishara et al.
2015/0004316 A1 1/2015 Thompson et al.
2015/0004317 A1 1/2015 Dussarrat et al.
2015/0007770 A1 1/2015 Chandrasekharan et al.
2015/0014632 A1 1/2015 Kim et al.
2015/0021599 A1 1/2015 Ridgeway
2015/0024609 A1 1/2015 Milligan et al.
2015/0048485 A1 2/2015 Tolle
2015/0078874 A1 3/2015 Sansoni et al.
2015/0086316 A1 3/2015 Greenberg et al.
2015/0091057 A1 4/2015 Xie et al.
2015/0096973 A1 4/2015 Dunn et al.
2015/0099072 A1 4/2015 Takamure et al.
2015/0111374 A1 4/2015 Bao
2015/0132212 A1 5/2015 Winkler et al.
2015/0140210 A1 5/2015 Jung et al.
2015/0147483 A1 5/2015 Fukazawa
2015/0147877 A1 5/2015 Jung
2015/0162214 A1 6/2015 Thompson
2015/0167159 A1 6/2015 Halpin et al.
2015/0170954 A1 6/2015 Agarwal et al.
2015/0174768 A1 6/2015 Rodnick
2015/0179427 A1 6/2015 Hirose et al.
2015/0184291 A1 7/2015 Alokozai et al.
2015/0187568 A1 7/2015 Pettinger et al.
2015/0217456 A1 8/2015 Tsuji et al.
2015/0240359 A1 8/2015 Jdira et al.
2015/0255324 A1 9/2015 Li et al.
2015/0267295 A1 9/2015 Hill et al.
2015/0267297 A1 9/2015 Shiba
2015/0267299 A1 9/2015 Hawkins et al.
2015/0267301 A1 9/2015 Hill et al.
2015/0284848 A1 10/2015 Nakano et al.
2015/0287626 A1 10/2015 Arai
2015/0308586 A1 10/2015 Shugrue et al.
2015/0315704 A1 11/2015 Nakano et al.
2015/0376211 A1 12/2015 Girard
2016/0013042 A1 1/2016 Hashimoto et al.
2016/0020094 A1 1/2016 Van Aerde et al.
2016/0093528 A1 3/2016 Chandrashekar et al.
2016/0141176 A1 5/2016 Van Aerde et al.

FOREIGN PATENT DOCUMENTS

CN 101522943 9/2009
CN 101423937 9/2011
CN 102383106 3/2012
DE 102008052750 6/2009
EP 2036600 3/2009
EP 2426233 7/2012
JP 03-044472 2/1991
JP 04115531 4/1992
JP 07-034936 8/1995
JP 7-272694 10/1995
JP 07283149 10/1995
JP 08-181135 7/1996
JP 08335558 12/1996
JP 10-064696 3/1998
JP 10-0261620 9/1998
JP 2845163 1/1999
JP 2001-15698 1/2001
JP 2001342570 12/2001
JP 2004014952 A 1/2004
JP 2004091848 3/2004
JP 2004134553 4/2004
JP 2004294638 10/2004
JP 2004310019 11/2004
JP 2004538374 12/2004
JP 2005507030 3/2005
JP 2006186271 7/2006
JP 3140111 3/2008
JP 2008060304 3/2008
JP 2008527748 7/2008

(56) References Cited

FOREIGN PATENT DOCUMENTS

| | | |
|---|---|---|
| JP | 2008202107 | 9/2008 |
| JP | 2009016815 | 1/2009 |
| JP | 2009099938 | 5/2009 |
| JP | 2010097834 | 4/2010 |
| JP | 2010205967 | 9/2010 |
| JP | 2010251444 | 10/2010 |
| JP | 2012089837 | 5/2012 |
| JP | 2012146939 | 8/2012 |
| KR | 20100032812 | 3/2010 |
| TW | I226380 | 1/2005 |
| TW | 200701301 A | 1/2007 |
| WO | 9832893 | 7/1998 |
| WO | 2004008827 | 1/2004 |
| WO | 2004010467 | 1/2004 |
| WO | 2006054854 | 5/2006 |
| WO | 2006056091 A1 | 6/2006 |
| WO | 2006078666 | 7/2006 |
| WO | 2006080782 | 8/2006 |
| WO | 2006101857 | 9/2006 |
| WO | 2007140376 | 12/2007 |
| WO | 2009154889 | 12/2009 |
| WO | 2010039363 | 4/2010 |
| WO | 2010118051 | 1/2011 |
| WO | 2011019950 | 2/2011 |
| WO | 2013078065 | 5/2013 |
| WO | 2013078066 | 5/2013 |
| WO | 2014107290 | 7/2014 |

OTHER PUBLICATIONS

USPTO; Notice of Allowance dated Jul. 16, 2015 in U.S. Appl. No. 13/563,066.
USPTO; Notice of Allowance dated Aug. 4, 2015 in U.S. Appl. No. 13/677,133.
USPTO; Non-Final Office Action dated Jul. 30, 2015 in U.S. Appl. No. 13/941,216.
USPTO; Non-Final Office Action dated Jun. 29, 2015 in U.S. Appl. No. 13/966,782.
USPTO; Final Office Action dated Jul. 14, 2015 in U.S. Appl. No. 14/457,058.
USPTO; Notice of Allowance dated Jul. 6, 2015 in U.S. Appl. No. 29/447,298.
USPTO; Office Action dated Aug. 27, 2010 in Application No. 12/118,596.
USPTO; Office Action dated Feb. 15, 2011 in Application No. 12/118,596.
USPTO; Notice of Allowance dated Aug. 04, 2011 in Application No. 12/118,596.
USPTO; Notice of Allowance dated Jun. 16, 2011 in U.S. Appl. No. 12/430,751.
USPTO; Notice of Allowance dated Jul. 27, 2011 in U.S. Appl. No. 12/430,751.
USPTO; Restriction Requirement dated Jan. 15, 2013 in U.S. Appl. No. 12/754,223.
USPTO; Office Action dated Feb. 26, 2013 in U.S. Appl. No. 12/754,223.
USPTO; Final Office Action dated Jun. 28, 2013 in U.S. Appl. No. 12/754,223.
USPTO; Office Action dated Feb. 25, 2014 in U.S. Appl. No. 12/754,223.
USPTO; Final Office Action dated Jul. 14, 2014 in U.S. Appl. No. 12/754,223.
USPTO; Non-Final Office Action dated Mar. 25, 2015 in U.S. Appl. No. 12/754,223.
USPTO; Office Action dated Apr. 23, 2013 in U.S. Appl. No. 12/763,037.
USPTO; Final Office Action dated Oct. 21, 2013 in U.S. Appl. No. 12/763,037.
USPTO; Office Action dated Oct. 8, 2014 in U.S. Appl. No. 12/763,037.
USPTO; Notice of Allowance dated Jan. 27, 2015 in U.S. Appl. No. 12/763,037.
USPTO; Restriction Requirement dated Sep. 25, 2012 in U.S. Appl. No. 12/854,818.
USPTO; Office Action dated Dec. 6, 2012 in U.S. Appl. No. 12/854,818.
USPTO; Final Office Action dated Mar. 13, 2013 in U.S. Appl. No. 12/854,818.
USPTO; Office Action dated Aug. 30, 2013 in U.S. Appl. No. 12/854,818.
USPTO; Final Office Action dated Mar. 26, 2014 in U.S. Appl. No. 12/854,818.
USPTO; Office Action dated Jun. 3, 2014 in U.S. Appl. No. 12/854,818.
USPTO; Restriction Requirement dated May 8, 2013 in U.S. Appl. No. 13/102,980.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Notice of Allowance dated Jul. 3, 2014 in U.S. Appl. No. 13/102,980.
USPTO; Non-Final Office Action dated Sep. 17, 2014 in U.S. Appl. No. 13/187,300.
USPTO; Final Office Action dated Apr. 15, 2015 in U.S. Appl. No. 13/187,300.
USPTO; Non-Final Office Action dated Jul. 2, 2014 in U.S. Appl. No. 13/283,408.
USPTO; Final Office Action dated Jan. 29, 2015 in U.S. Appl. No. 13/283,408.
USPTO; Non-Final Office Action dated Jun. 17, 2015 in U.S. Appl. No. 13/283,408.
USPTO; Restriction Requirement dated Dec. 16, 2013 in U.S. Appl. No. 13/284,642.
USPTO; Restriction Requirement dated Apr. 21, 2014 in U.S. Appl. No. 13/284,642.
USPTO; Office Action dated Jul. 30, 2014 in U.S. Appl. No. 13/284,642.
USPTO; Notice of Allowance dated Feb. 11, 2015 in U.S. Appl. No. 13/284,642.
USPTO; Office Action dated Jan. 28, 2014 in U.S. Appl. No. 13/312,591.
USPTO; Final Office Action dated May 14, 2014 in U.S. Appl. No. 13/312,591.
USPTO; Non-Final Office Action dated Nov. 26, 2014 in U.S. Appl. No. 13/312,591.
USPTO; Final Office Action dated Mar. 20, 2015 in U.S. Appl. No. 13/312,591.
USPTO; Notice of Allowance dated May 14, 2015 in U.S. Appl. No. 13/312,591.
USPTO; Office Action dated Jan. 10, 2013 in U.S. Appl. No. 13/339,609.
USPTO; Office Action dated Feb. 11, 2013 in U.S. Appl. No. 13/339,609.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Office Action dated Feb. 13, 2014 in U.S. Appl. No. 13/411,271.
USPTO; Office Action dated Jul. 31, 2014 in U.S. Appl. No. 13/411,271.
USPTO; Final Office Action dated Jan. 16, 2015 in U.S. Appl. No. 13/411,271.
USPTO; Restriction Requirement dated Oct. 29, 2013 in U.S. Appl. No. 13/439,528.
USPTO; Office Action dated Feb. 4, 2014 in U.S. Appl. No. 13/439,528.

(56) References Cited

OTHER PUBLICATIONS

USPTO; Final Office Action dated Jul. 8, 2014 in U.S. Appl. No. 13/439,528.
USPTO; Notice of Allowance dated Oct. 21, 2014 in U.S. Appl. No. 13/439,528.
USPTO; Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.
USPTO; Office Action dated Dec. 20, 2013 in U.S. Appl. No. 13/535,214.
USPTO; Final Office Action dated Jun. 18, 2014 in U.S. Appl. No. 13/535,214.
USPTO; Notice of Allowance dated Oct. 23, 2014 in U.S. Appl. No. 13/535,214.
USPTO; Non-Final Office Action dated Aug. 8, 2014 in U.S. Appl. No. 13/563,066.
USPTO; Final Office Action dated Feb. 12, 2015 in U.S. Appl. No. 13/563,066.
USPTO; Notice of Allowance dated Jun. 12, 2015 in U.S. Appl. No. 13/563,066.
USPTO; Non-Final Office Action dated Oct. 15, 2014 in U.S. Appl. No. 13/597,043.
USPTO; Final Office Action dated Mar. 13, 2015 in U.S. Appl. No. 13/597,043.
USPTO; Non-Final Office Action dated Feb. 12, 2015 in U.S. Appl. No. 13/597,108.
USPTO; Final Office Action dated Jun. 1, 2015 in U.S. Appl. No. 13/597,108.
USPTO; Office Action dated Nov. 15, 2013 in U.S. Appl. No. 13/612,538.
USPTO; Office Action dated Jul. 10, 2014 in U.S. Appl. No. 13/612,538.
USPTO; Non-Final Office Action dated May 28, 2015 in U.S. Appl. No. 13/651,144.
USPTO; Non-Final Office Action dated Apr. 3, 2015 in U.S. Appl. No. 13/677,133.
USPTO; Office Action dated Jun. 2, 2014 in U.S. Appl. No. 13/677,151.
USPTO; Final Office Action dated Nov. 14, 2014 in U.S. Appl. No. 13/677,151.
USPTO; Notice of Allowance dated Feb. 26, 2015 in U.S. Appl. No. 13/677,151.
USPTO; Office Action dated Apr. 24, 2014 in U.S. Appl. No. 13/784,362.
USPTO; Notice of Allowance dated Aug. 13, 2014 in U.S. Appl. No. 13/784,362.
USPTO; Final Office Action dated Mar. 25, 2015 in U.S. Appl. No. 13/791,246.
USPTO; Restriction Requirement dated Jun. 26, 2014 in U.S. Appl. No. 13/874,708.
USPTO; Non-Final Office Action dated Oct. 9, 2014 in U.S. Appl. No. 13/874,708.
USPTO; Notice of Allowance dated Mar. 10, 2015 in U.S. Appl. No. 13/874,708.
USPTO; Restriction Requirement dated May 8, 2014 in U.S. Appl. No. 13/791,246.
USPTO; Non-Final Office Action dated Sep. 19, 2014 in U.S. Appl. No. 13/791,246.
USPTO; Non-Final Office Action dated Sep. 12, 2014 in U.S. Appl. No. 13/941,134.
USPTO; Notice of Allowance dated Jan. 20, 2015 in U.S. Appl. No. 13/941,134.
USPTO; Restriction Requirement dated Apr. 30, 2015 in U.S. Appl. No. 13/941,216.
USPTO; Restriction Requirement dated Sep. 16, 2014 in U.S. Appl. No. 13/948,055.
USPTO; Non-Final Office Action dated Oct. 30, 2014 in U.S. Appl. No. 13/948,055.
USPTO; Restriction Requirement Action dated Jan. 28, 2015 in U.S. Appl. No. 14/018,345.
USPTO; Non-Final Office Action dated Apr. 7, 2015 in U.S. Appl. No. 14/018,345.
USPTO; Non-Final Office Action dated Apr. 28, 2015 in Application No. 14/040,196.
USPTO; Non-Final Office Action dated Mar. 19, 2015 in Application No. 14/079,302.
USPTO; Non-Final Office Action dated Mar. 19, 2015 in Application No. 14/166,462.
USPTO; Office Action dated May 29, 2014 in Application No. 14/183,187.
USPTO; Final Office Action dated Nov. 07, 2014 in Application No. 14/183,187.
USPTO; Non-Final Office Action dated Mar. 16, 2015 in Application No. 14/183,187.
USPTO; Non-Final Office Action dated Feb. 12, 2015 in U.S. Appl. No. 14/457,058.
USPTO; Non-Final Office Action dated Jan. 16, 2015 in U.S. Appl. No. 14/563,044.
USPTO; Non-Final Office Action dated Mar. 16, 2015 in U.S. Appl. No. 29/447,298.
PCT; International Search report and Written Opinion dated Nov. 12, 2010 in Application No. PCT/US2010/030126.
PCT; International Preliminary Report on Patentability dated Oct. 11, 2011 Application No. PCT/US2010/030126.
PCT; International Search report and Written Opinion dated Jan. 12, 2011 in Application No. PCT/US2010/045368.
PCT; International Search report and Written Opinion dated Feb. 6, 2013 in Application No. PCT/US2012/065343.
PCT; International Search report and Written Opinion dated Feb. 13, 2013 in Application No. PCT/US2012/065347.
Chinese Patent Office; Office Action dated Jan. 10, 2013 in Application No. 201080015699.9.
Chinese Patent Office; Office Action dated Jan. 12, 2015 in Application No. 201080015699.9.
Chinese Patent Office; Notice on the First Office Action dated May 24, 2013 in Application No. 201080036764.6.
Chinese Patent Office; Notice on the Second Office Action dated Jan. 2, 2014 in Application No. 201080036764.6.
Chinese Patent Office; Notice on the Third Office Action dated Jul. 1, 2014 in Application No. 201080036764.6.
Chinese Patent Office; Notice on the First Office Action dated Feb. 8, 2014 in Application No. 201110155056.
Chinese Patent Office; Notice on the Second Office Action dated Sep. 16, 2014 in Application No. 201110155056.
Chinese Patent Office; Notice on the Third Office Action dated Feb. 9, 2015 in Application No. 201110155056.
Japanese Patent Office; Office Action dated Jan. 25, 2014 in Application No. 2012-504786.
Japanese Patent Office; Office Action dated Dec. 1, 2014 in Application No. 2012-504786.
Taiwan Patent Office; Office Action dated Jul. 4, 2014 in Application No. 099110511.
Taiwan Patent Office; Office Action dated Dec. 19, 2014 in Taiwan Application No. 099127063.
Bearzotti, et al., "Fast Humidity Response of a Metal Halide-Doped Novel Polymer," Sensors and Actuators B, 7, pp. 451-454, (1992).
Chang et al. "Small-Subthreshold-Swing and Low-Voltage Flexible Organic Thin-Film Transistors Which Use HfLaO as the Gate Dielectric," IEEE Electron Device Society, 30, pp. 133-135, (2009).
Crowell, "Chemical Methods of Thin Film Deposition: Chemical Vapor Deposition, Atomic Layer Deposition, and Related Technologies," Journal of Vacuum Science & Technology, S88-S95, (2003).
Koutsokeras et al., "Texture and Microstructure Evolution in Single-Phase TixTa1-xN Alloys of Rocksalt Structure" Journal of Applied Physics, 110, pp. 043535-1-043535-6, (2011).
Maeng et al., "Electrical Properties of Atomic Layer Disposition Hf02 and Hf0xNy on Si Substrates with Various Crystal Orientations," Journal of the Electrochemical Society, 155, pp. H267-H271,

(56) References Cited

OTHER PUBLICATIONS

Department of Materials Science and Engineering, Pohang University of Science and Technology, Pohang, Korea (2008).
Novaro et al., "Theoretical Study on a Reaction Pathway of Ziegler-Natta-Type Catalysis," J. Chem. Phys., 68, pp. 2337-2351, (1978).
Varma, et al., "Effect of Metal Halides on Thermal, Mechanical, and Electrical Properties of Polypyromelitimide Films," Journal of Applied Polymer Science, 32, pp. 3987-4000, (1986).
USPTO; Non-Final Office Action dated Apr. 1, 2010 in U.S. Appl. No. 12/357,174.
USPTO; Final Office Action dated Sep. 1, 2010 in U.S. Appl. No. 12/357,174.
USPTO; Notice of Allowance dated Dec. 13, 2010 in U.S. Appl. No. 12/357,174.
USPTO; Non-Final Office Action dated Dec. 29, 2010 in U.S. Appl. No. 12/362,023.
USPTO; Non-Final Office Action dated Jul. 26, 2011 in U.S. Appl. No. 12/416,809.
USPTO; Final Office Action dated Dec. 6, 2011 in U.S. Appl. No. 12/416,809.
USPTO; Notice of Allowance dated Oct. 1, 2010 in U.S. Appl. No. 12/467,017.
USPTO; Non-Final Office Action dated Mar. 18, 2010 in U.S. Appl. No. 12/489,252.
USPTO; Notice of Allowance dated Sep. 2, 2010 in U.S. Appl. No. 12/489,252.
USPTO; Non-Final Office Action dated Dec. 15, 2010 in U.S. Appl. No. 12/553,759.
USPTO; Final Office Action dated May 4, 2011 in U.S. Appl. No. 12/553,759.
USPTO; Non-Final Office Action dated Sep. 6, 2011 in U.S. Appl. No. 12/553,759.
USPTO; Notice of Allowance dated 01/247/2012 in U.S. Appl. No. 12/553,759.
USPTO; Non-Final Office Action dated Oct. 19, 2012 in U.S. Appl. No. 12/618,355.
USPTO; Final Office Action dated May 8, 2013 in U.S. Appl. No. 12/618,355.
USPTO; Non-Final Office Action dated Apr. 8, 2015 in U.S. Appl. No. 12/618,355.
USPTO; Final Office Action dated Oct. 22, 2015 in U.S. Appl. No. 12/618,355.
USPTO; Non-Final Office Action dated Feb. 16, 2012 in U.S. Appl. No. 12/618,419.
USPTO; Final Office Action dated Jun. 22, 2012 in U.S. Appl. No. 12/618,419.
USPTO; Non-Final Office Action dated Nov. 27, 2012 in U.S. Appl. No. 12/618,419.
USPTO; Notice of Allowance dated Apr. 12, 2013 in U.S. Appl. No. 12/618,419.
USPTO; Non-Final Office Action dated Dec. 6, 2011 in U.S. Appl. No. 12/718,731.
USPTO; Notice of Allowance dated Mar. 16, 2012 in U.S. Appl. No. 12/718,731.
USPTO; Non-Final Office Action dated Jan. 24, 2011 in U.S. Appl. No. 12/778,808.
USPTO; Notice of Allowance dated May 9, 2011 in U.S. Appl. No. 12/778,808.
USPTO; Notice of Allowance dated Oct. 12, 2012 in U.S. Appl. No. 12/832,739.
USPTO; Non-Final Office Action dated Oct. 16, 2012 in U.S. Appl. No. 12/847,848.
USPTO; Final Office Action dated Apr. 22, 2013 in U.S. Appl. No. 12/847,848.
USPTO; Notice of Allowance dated Jan. 16, 2014 in U.S. Appl. No. 12/847,848.
USPTO; Non-Final Office Action dated Jul. 11, 2012 in U.S. Appl. No. 12/875,889.
USPTO; Notice of Allowance dated Jan. 4, 2013 in U.S. Appl. No. 12/875,889.
USPTO; Notice of Allowance dated Jan. 9, 2012 in U.S. Appl. No. 12/901,323.
USPTO; Non-Final Office Action dated Nov. 20, 2013 in U.S. Appl. No. 12/910,607.
USPTO; Final Office Action dated Apr. 28, 2014 in U.S. Appl. No. 12/910,607.
USPTO; Notice of Allowance dated Aug. 15, 2014 in U.S. Appl. No. 12/910,607.
USPTO; Non-Final Office Action dated Oct. 24, 2012 in U.S. Appl. No. 12/940,906.
USPTO; Final Office Action dated Feb. 13, 2013 in U.S. Appl. No. 12/940,906.
USPTO; Notice of Allowance dated Apr. 23, 2013 in U.S. Appl. No. 12/940,906.
USPTO; Non-Final Office Action dated Dec. 7, 2012 in U.S. Appl. No. 12/953,870.
USPTO; Final Office Action dated Apr. 22, 2013 in U.S. Appl. No. 12/953,870.
USPTO; Non-Final Office Action dated Sep. 19, 2012 in U.S. Appl. No. 13/016,735.
USPTO; Final Office Action dated Feb. 11, 2013 in U.S. Appl. No. 13/016,735.
USPTO; Notice of Allowance dated Apr. 24, 2013 in U.S. Appl. No. 13/016,735.
USPTO; Non-Final Office Action dated Apr. 4, 2012 in U.S. Appl. No. 13/030,438.
USPTO; Final Office Action dated Aug. 22, 2012 in U.S. Appl. No. 13/030,438.
USPTO; Notice of Allowance dated Oct. 24, 2012 in U.S. Appl. No. 13/030,438.
USPTO; Non-Final Office Action dated Dec. 3, 2012 in U.S. Appl. No. 13/040,013.
USPTO; Notice of Allowance dated May 3, 2013 in U.S. Appl. No. 13/040,013.
USPTO; Notice of Allowance dated Sep. 13, 2012 in U.S. Appl. No. 13/085,968.
USPTO; Non-Final Office Action dated Mar. 29, 2013 in U.S. Appl. No. 13/094,402.
USPTO; Final Office Action dated Jul. 17, 2013 in U.S. Appl. No. 13/094,402.
USPTO; Notice of Allowance dated Sep. 30, 2013 in U.S. Appl. No. 13/094,402.
USPTO; Non-Final Office Action dated Jul. 17, 2014 in U.S. Appl. No. 13/154,271.
USPTO; Final Office Action dated Jan. 2, 2015 in U.S. Appl. No. 13/154,271.
USPTO; Non-Final Office Action dated May 27, 2015 in U.S. Appl. No. 13/154,271.
USPTO; Non-Final Office Action dated Oct. 27, 2014 in U.S. Appl. No. 13/169,951.
USPTO; Final Office Action dated May 26, 2015 in U.S. Appl. No. 13/169,591.
USPTO; Non-Final Office Action dated Sep. 1, 2015 in U.S. Appl. No. 13/169,951.
USPTO; Non-Final Office Action dated Jun. 24, 2014 in U.S. Appl. No. 13/181,407.
USPTO; Final Office Action dated Sep. 24, 2014 in U.S. Appl. No. 13/181,407.
USPTO; Non-Final Office Action dated Jan. 2, 2015 in U.S. Appl. No. 13/181,407.
USPTO; Final Office Action dated Apr. 8, 2015 in U.S. Appl. No. 13/181,407.
USPTO; Non-Final Office Action dated Jan. 23, 2013 in U.S. Appl. No. 13/184,351.
USPTO; Final Office Action dated Jul. 29, 2013 in U.S. Appl. No. 13/184,351.
USPTO; Non-Final Office Action dated Jul. 16, 2014 in U.S. Appl. No. 13/184,351.
USPTO; Final Office Action dated Feb. 17, 2015 in U.S. Appl. No. 13/184,351.
USPTO; Non-Final Office Action dated Aug. 10, 2015 in U.S. Appl. No. 13/184,351.

(56) References Cited

OTHER PUBLICATIONS

USPTO; Non-Final Office Action dated Oct. 1, 2012 in U.S. Appl. No. 13/191,762.
USPTO; Final Office Action dated Apr. 10, 2013 in U.S. Appl. No. 13/191,762.
USPTO; Notice of Allowance dated Aug. 15, 2013 in U.S. Appl. No. 13/191,762.
USPTO; Non-Final Office Action dated Oct. 22, 2012 in U.S. Appl. No. 13/238,960.
USPTO; Final Office Action dated May 3, 2013 in U.S. Appl. No. 13/238,960.
USPTO; Non-Final Office Action dated Apr. 26, 2013 in U.S. Appl. No. 13/250,721.
USPTO; Notice of Allowance dated Sep. 11, 2013 in U.S. Appl. No. 13/250,721.
USPTO; Non-Final Office Action dated Apr. 9, 2014 in U.S. Appl. No. 13/333,420.
USPTO; Notice of Allowance dated Sep. 15, 2014 in U.S. Appl. No. 13/333,420.
USPTO; Non-Final Office Action dated Oct. 10, 2012 in U.S. Appl. No. 13/406,791.
USPTO; Final Office Action dated Jan. 31, 2013 in U.S. Appl. No. 13/406,791.
USPTO; Non-Final Office Action dated Apr. 25, 2013 in U.S. Appl. No. 13/406,791.
USPTO; Final Office Action dated Aug. 23, 2013 in U.S. Appl. No. 13/406,791.
USPTO; Non-Final Office Action dated Dec. 4, 2013 in U.S. Appl. No. 13/406,791.
USPTO; Final Office Action dated Apr. 21, 2014 in U.S. Appl. No. 13/406,791.
USPTO; Non-Final Office Action dated Jan. 14, 2013 in U.S. Appl. No. 13/410,970.
USPTO; Notice of Allowance dated Feb. 14, 2013 in U.S. Appl. No. 13/410,970.
USPTO; Notice of Allowance dated Oct. 6, 2015 in U.S. Appl. No. 13/411,271.
USPTO; Non-Final Office Action dated Apr. 11, 2013 in U.S. Appl. No. 13/450,368.
USPTO; Notice of Allowance dated Jul. 17, 2013 in U.S. Appl. No. 13/450,368.
USPTO; Non-Final Office Action dated Oct. 17, 2013 in U.S. Appl. No. 13/493,897.
USPTO; Notice of Allowance dated Mar. 20, 2014 in U.S. Appl. No. 13/493,897.
USPTO; Non-Final Office Action dated Sep. 11, 2013 in U.S. Appl. No. 13/550,419.
USPTO; Final Office Action dated Jan. 27, 2014 in U.S. Appl. No. 13/550,419.
USPTO; Notice of Allowance dated May 29, 2014 in U.S. Appl. No. 13/550,419.
USPTO; Non-Final Office Action dated Nov. 7, 2013 in U.S. Appl. No. 13/565,564.
USPTO; Final Office Action dated Feb. 28, 2014 in U.S. Appl. No. 13/565,564.
USPTO; Non-Final Office Action dated Jul. 2, 2014 in U.S. Appl. No. 13/565,564.
USPTO; Notice of Allowance dated Nov. 3, 2014 in U.S. Appl. No. 13/565,564.
USPTO; Non-Final Office Action dated Aug. 30, 2013 in Application No. 13/570,067.
USPTO; Notice of Allowance dated Jan. 06, 2014 in Application No. 13/570,067.
USPTO; Notice of Allowance dated Aug. 28, 2015 in Application No. 13/597,043.
USPTO; Non-Final Office Action dated Dec. 08, 2015 in Application No. 13/597,108.
USPTO; Notice of Allowance dated Mar. 27, 2014 in Application No. 13/604,498.
USPTO; Non-Final Office Action dated Apr. 15, 2015 in U.S. Appl. No. 13/646,403.
USPTO; Final Office Action dated Oct. 15, 2015 in U.S. Appl. No. 13/646,403.
USPTO; Non-Final Office Action dated May 15, 2014 in U.S. Appl. No. 13/646,471.
USPTO; Final Office Action dated Aug. 18, 2014 in U.S. Appl. No. 13/646,471.
USPTO; Non-Final Office Action dated Dec. 16, 2014 in U.S. Appl. No. 13/646/,471.
USPTO; Final Office Action dated Apr. 21, 2015 in U.S. Appl. No. 13/646,471.
USPTO; Non-Final Office Action dated Aug. 19, 2015 in U.S. Appl. No. 13/646,471.
USPTO; Final Office Action dated Nov. 19, 2015 in U.S. Appl. No. 13/651,144.
USPTO; Non-Final Office Action dated Jun. 18, 2015 in U.S. Appl. No. 13/665,366.
USPTO; Notice of Allowance dated Aug. 24, 2015 in U.S. Appl. No. 13/677,133.
USPTO; Non-Final Office Action dated Aug. 20, 2013 in U.S. Appl. No. 13/679,502.
USPTO; Final Office Action dated Feb. 25, 2014 in U.S. Appl. No. 13/679,502.
USPTO; Notice of Allowance dated May 2, 2014 in U.S. Appl. No. 13/679,502.
USPTO; Non-Final Office Action dated Jul. 21, 2015 in U.S. Appl. No. 13/727,324.
USPTO; Non-Final Office Action dated Oct. 24, 2013 in U.S. Appl. No. 13/749,878.
USPTO; Non-Final Office Action dated Jun. 18, 2014 in U.S. Appl. No. 13/749,878.
USPTO; Final Office Action dated Dec. 10, 2014 in U.S. Appl. No. 13/749,878.
USPTO; Notice of Allowance Mar. 13, 2015 dated in U.S. Appl. No. 13/749,878.
USPTO; Non-Final Office Action dated Dec. 19, 2013 in U.S. Appl. No. 13/784,388.
USPTO; Notice of Allowance dated Jun. 4, 2014 in U.S. Appl. No. 13/784,388.
USPTO; Non-Final Office Action dated Oct. 26, 2015 in U.S. Appl. No. 13/791,246.
USPTO; Non-Final Office Action dated Nov. 6, 2015 in U.S. Appl. No. 13/791,339.
USPTO; Non-Final Office Action dated Mar. 21, 2014 in U.S. Appl. No. 13/799,708.
USPTO; Notice of Allowance dated Oct. 31, 2014 in U.S. Appl. No. 13/799,708.
USPTO; Notice of Allowance dated Apr. 10, 2014 in U.S. Appl. No. 13/901,341.
USPTO; Notice of Allowance dated Jun. 6, 2014 in U.S. Appl. No. 13/901,341.
USPTO; Non-Final Office Action dated Jan. 2, 2015 in U.S. Appl. No. 13/901,372.
USPTO; Final Office Action dated Apr. 16, 2015 in U.S. Appl. No. 13/901,372.
USPTO; Non-Final Office Action dated Jul. 8, 2015 in U.S. Appl. No. 13/901,400.
USPTO; Notice of Allowance dated Aug. 5, 2015 in U.S. Appl. No. 13/901,372.
USPTO; Non-Final Office Action dated Apr. 24, 2014 in U.S. Appl. No. 13/912,666.
USPTO; Final Office Action dated Sep. 25, 2014 in U.S. Appl. No. 13/912,666.
USPTO; Non-Final Office Action dated Jan. 26, 2015 in U.S. Appl. No. 13/912,666.
USPTO; Notice of Allowance dated Jun. 25, 2015 in U.S. Appl. No. 13/912,666.
USPTO; Non-Final Office Action dated Dec. 16, 2014 in U.S. Appl. No. 13/915,732.
USPTO; Final Office Action dated Apr. 10, 2015 in U.S. Appl. No. 13/915,732.

(56) References Cited

OTHER PUBLICATIONS

USPTO; Notice of Allowance dated Jun. 19, 2015 in U.S. Appl. No. 13/915,732.
USPTO; Notice of Allowance dated Mar. 17, 2015 in U.S. Appl. No. 13/923,197.
USPTO; Notice of Allowance dated Oct. 7, 2015 in U.S. Appl. No. 13/973,777.
USPTO; Non-Final Office Action dated Feb. 20, 2015 in U.S. Appl. No. 14/018,231.
USPTO; Notice of Allowance dated Jul. 20, 2015 in U.S. Appl. No. 14/018,231.
USPTO; USPTO; Final Office Action dated Sep. 14, 2015 in U.S. Appl. No. 14/018,345.
USPTO; Non-Final Office Action dated Mar. 26, 2015 in U.S. Appl. No. 14/031,982.
USPTO; Final Office Action dated Aug. 28, 2015 in U.S. Appl. No. 14/031,982.
USPTO; Notice of Allowance dated Nov. 17, 2015 in U.S. Appl. No. 14/031,982.
USPTO; Notice of Allowance dated Sep. 11, 2015 in U.S. Appl. No. 14/040,196.
USPTO; Non-Final Office Action dated Dec. 15, 2014 in U.S. Appl. No. 14/065,114.
USPTO; Final Office Action dated Jun. 19, 2015 in U.S. Appl. No. 14/065,114.
USPTO; Non-Final Office Action dated Oct. 7, 2015 in U.S. Appl. No. 14/065,114.
USPTO; Non-Final Office Action dated Nov. 14, 2014 in U.S. Appl. No. 14/069,244.
USPTO; Notice of Allowance dated Mar. 25, 2015 in U.S. Appl. No. 14/069,244.
USPTO; Non-Final Office Action dated Sep. 9, 2015 in U.S. Appl. No. 14/090,750.
USPTO; Final Office Action dated Sep. 1, 2015 in U.S. Appl. No. 14/079,302.
USPTO; Notice of Allowance dated Sep. 3, 2015 in U.S. Appl. No. 14/166,462.
USPTO; Non-Final Office Action dated Nov. 17, 2015 in U.S. Appl. No. 14/172,220.
USPTO; Final Office Action dated Jul. 10, 2015 in U.S. Appl. No. 14/183,187.
USPTO; Non-Final Office Action dated Oct. 8, 2015 in U.S. Appl. No. 14/218,374.
USPTO; Non-Final Office Action dated Sep. 22, 2015 in U.S. Appl. No. 14/219,839.
USPTO; Non-Final Office Action dated Nov. 25, 2015 in U.S. Appl. No. 14/219,879.
USPTO; Non-Final Office Action dated Sep. 18, 2015 in U.S. Appl. No. 14/244,689.
USPTO; Non-Final Office Action dated Nov. 20, 2015 in U.S. Appl. No. 14/260,701.
USPTO; Non-Final Office Action dated Aug. 19, 2015 in U.S. Appl. No. 14/268,348.
USPTO; Non-Final Office Action dated Oct. 20, 2015 in U.S. Appl. No. 14/281,477.
USPTO; Non-Final Office Action dated Nov. 6, 2015 in U.S. Appl. No. 14/457,058.
USPTO; Non-Final Office Action dated Apr. 10, 2015 in U.S. Appl. No. 14/505,290.
USPTO; Notice of Allowance dated Aug. 21, 2015 in U.S. Appl. No. 14/505,290.
USPTO; Final Office Action dated Jul. 16, 2015 in U.S. Appl. No. 14/563,044.
USPTO; Notice of Allowance dated Dec. 2, 2015 in U.S. Appl. No. 14/563,044.
USPTO; Non-Final Office Action dated Oct. 1, 2015 in U.S. Appl. No. 14/571,126.
USPTO; Non-Final Office Action dated Nov. 19, 2015 in U.S. Appl. No. 14/659,437.
USPTO; Notice of Allowance dated Nov. 26, 2014 in U.S. Appl. No. 29/481,301.
USPTO; Notice of Allowance dated Feb. 17, 2015 in U.S. Appl. No. 29/481,308.
USPTO; Notice of Allowance dated Jan. 12, 2015 in U.S. Appl. No. 29/481,312.
USPTO; Notice of Allowance dated Apr. 30, 2015 in U.S. Appl. No. 29/481,315.
USPTO; Notice of Allowance dated May 11, 2015 in U.S. Appl. No. 29/511,011.
USPTO; Notice of Allowance dated May 11, 2015 in U.S. Appl. No. 29/514,153.
Bhatnagar et al., "Copper Interconnect Advances to Meet Moore's Law Milestones," Solid State Technology, 52, 10 (2009).
Buriak, "Organometallic Chemistry on Silicon and Germanium Surfaces," Chemical Reviews, 102, 5 (2002).
Cant et al., "Chemisorption Sites on Porous Silica Glass and on Mixed-Oxide Catalysis," Can. J. Chem. 46, 1373 (1968).
Chen et al., "A Self-Aligned Airgap Interconnect Scheme," IEEE International Interconnect Technology Conference, vol. 1-3, 146-148 (2009).
Choi et al., "Improvement of Silicon Direct Bonding using Surfaces Activated by Hydrogen Plasma Treatement," Journal of the Korean Physical Society, 37, 6, 878-881 (2000).
Choi et al., "Low Temperature Formation of Silicon Oxide Thin Films by Atomic Layer Deposition Using NH3/O2 Plasma," ECS Solid State Letters, 2(12) p. 114-p. 116 (2013).
Cui et al., "Impact of Reductive N2/H2 Plasma on Porous Low-Dielectric Constant SiCOH Thin Films," Journal of Applied Physics 97, 113302, 1-8 (2005).
Dingemans et al., "Comparison Between Aluminum Oxide Surface Passivation Films Deposited with Thermal Aid," Plasma. Aid and Pecvd, 35th IEEE PVCS, Jun. (2010).
Drummond et al., "Hydrophobic Radiofrequency Plasma-Deposited Polymer Films. Dielectric Properties and Surface Forces," Colloids and Surfaces A, 129-130, 117-129 (2006).
Easley et al., "Thermal Isolation of Microchip Reaction Chambers for Rapid Non-Contact DNA Amplification," J. Micromech. Microeng. 17, 1758-1766 (2007).
Ge et al., "Carbon Nanotube-Based Synthetic Gecko Tapes," Department of Polymer Science, PNAS, 10792-10795 (2007).
George et al., "Atomic Layer Deposition: An Overview," Chem. Rev. 110, 111-131 (2010).
Grill et al., "The Effect of Plasma Chemistry on the Damage Induced Porous SiCOH Dielectrics," IBM Research Division, RC23683 (W0508-008), Materials Science, 1-19 (2005).
Heo et al., "Structural Characterization of Nanoporous Low-Dielectric Constant SiCOH Films Using Organosilane Precursors," NSTI-Nanotech, vol. 4, 122-123 (2007).
Jung et al., "Double Patterning of Contact Array with Carbon Polymer," Proc. of SPIE, 6924, 69240C, 1-10 (2008).
Katamreddy et al., "ALD and Characterization of Aluminum Oxide Deposited on Si(100) using Tris(diethylamino) Aluminum and Water Vapor," Journal of the Electrochemical Society, 153 (10) C701-C706(2006).
Kim et al., "Passivation Effect on Low-k S/OC Dielectrics by H2 Plasma Treatment," Journal of the Korean Physical Society, "40, 1, 94-98 (2002).
Kim et al., "Characteristics of Low Temperaure High Quality Silicon Oxide by Plasma Enhanced Atomic Layer Deposition with In-Situ Plasma Densification Process," The Electrochemical Society, ECS Transactions, College of Information and Communication Engineerign, Sunakyunkwan University, 53(1).
King, Plasma Enhanced Atomic Layer Deposition of SiNx: H and SiO2, J. Vac. Sci. Technol., A29(4) (2011).
Koo et al., "Characteristics of Al2O3 Thin Films Deposited Using Dimethylaluminum Isopropoxide and Trimethylaluminum Precursors by the Plasma-Enhanced Atomic-Layer Deposition Method," Journal of Physical Society, 48, 1, 131-136 (2006).
Kurosawa et al., "Synthesis and Characterization of Plasma-Polymerized Hexamethyldisiloxane Films," Thin Solid Films, 506-507, 176-179 (2006).

(56) References Cited

OTHER PUBLICATIONS

Lieberman, et al., "Principles of Plasma Discharges and Materials Processing," Second Edition, 368-381.
Lim et al., "Low-Temperature Growth of SiO2 Films by Plasma-Enhanced Atomic Layer Deposition," ETRI Journal, 27 (1), 118-121 (2005).
Liu et al., "Research, Design, and Experimen of End Effector for Wafer Transfer Robot," Industrial Robot: An International Journal, 79-91 (2012).
Mackus et al., "Optical Emission Spectroscopy as a Tool for Studying Optimizing, and Monitoring Plasma-Assisted Atomic Layer Deposition Processes," Journal of Vacuum Science and Technology, 77-87 (2010).
Maeno, "Gecko Tape Using Carbon Nanotubes," Nitto Denko Gihou, 47, 48-51.
Marsik et al., "Effect of Ultraviolet Curing Wavelength on Low-k Dielectric Material Proerties and Plasma Damage Resistance," Sciencedirect.com, 519, 11, 3619-3626 (2011).
Morishige et al., "Thermal Desorption and Infrared Studies of Ammonia Amines and Pyridines Chemisorbed on Chromic Oxide," J.Chem. Soc., Faraday Trans. 1, 78, 2947-2957 (1982).
Mukai et al., "A Study of CD Budget in Spacer Patterning Technology," Proc. of SPIE, 6924, 1-8 (2008).
Nogueira et al., "Production of Highly Hydrophobic Films Using Low Frequency and High Density Plasma," Revista Brasileira de Aplicacoes de Vacuo, 25(1), 45-53 (2006).
Schmatz et al., "Unusual Isomerization Reactions in 1.3-Diaza-2-Silcyclopentanes," Organometallics, 23, 1180-1182 (2004).
Scientific and Technical Information Center EIC 2800 Search Report dated Feb. 16, 2012.
Shamma et al., "PDL Oxide Enabled Doubling," Proc. of SPIE, 6924, 69240D, 1-10 (2008).
Wirths, et al, "SiGeSn Growth tudies Using Reduced Pressure Chemical Vapor Deposition Towards Optoeleconic Applications," This Soid Films, 557, 183-187 (2014).
USPTO; Notice of Allowance dated May 23, 2016 in U.S. Appl. No. 12/754,223.
USPTO; Non-Final Office Action dated Apr. 7, 2016 in U.S. Appl. No. 13/187,300.
USPTO; Notice of Allowance dated Mar. 28, 2016 in U.S. Appl. No. 13/283,408.
USPTO; Final Office Action dated Jun. 2, 2016 in U.S. Appl. No. 13/597,108.
USPTO; Non-Final Office Action dated May 10, 2016 in U.S. Appl. No. 13/651,144.
USPTO; Final Office Action dated Apr. 20, 2016 in U.S. Appl. No. 13/791,246.
USPTO; Final Office Action dated Apr. 12, 2016 in U.S. Appl. No. 13/791,339.
USPTO; Restriction Requirement dated May 20, 2016 in U.S. Appl. No. 14/218,690.
USPTO; Final Office Action dated Mar. 25, 2016 in U.S. Appl. No. 14/219,839.
USPTO; Notice of Allowance dated Jun. 2, 2016 in U.S. Appl. No. 14/260,701.
USPTO; Final Office Action dated Apr. 5, 2016 in U.S. Appl. No. 14/498,036.
USPTO; Final Office Action dated May 26, 2016 in U.S. Appl. No. 14/508,296.
USPTO; Notice of Allowance dated Jun. 2, 2016 in U.S. Appl. No. 14/571,126.
USPTO; Notice of Allowance dated May 31, 2016 in U.S. Appl. No. 14/659,437.
USPTO; Notice of Allowance dated Mar. 25, 2016 in U.S. Appl. No. 14/693,138.
USPTO; Non-Final Office Action dated Mar. 30, 2016 in U.S. Appl. No. 14/808,979.
Kobayshi, et al., "Temperature Dependence of SiO2 Film Growth with Plasma-Enhanced Atomic Layer Deposition," regarding Thin Solid Films, published by Elsevier in the International Journal on the Science and Technology of Condensed Matter, in vol. 520, No. 11, 3994-3998 (2012).
H.J. Yun et al., "Comparison of Atomic Scale Etching of Poly-Si in Inductively Coupled Ar and He Plasmas", Korean Journal of Chemical Engineering, vol. 24, year 2007, pp. 670-673.
Krenek et al. "IR Laser CVD of Nanodisperse Ge—Si—Sn Alloys Obtained by Dielectric Breakdown of GeH4/SiH4/SnH4 Mixtures", NanoCon 2014, Nov. 5-7, Brno, Czech Republic, EU.
Moeen, "Design, Modelling and Characterization of Si/SiGe Structures for IR Bolometer Applications," KTH Royal Institute of Technology. Information and Communication Technology, Department of Integrated Devices and Circuits, Stockholm Sweden 2015.
Presser, et al., "Effect of Pore Size on Carbon Dioxide Sorption by Carbide Derived Carbon," Energy & Environmental Science 4.8, 3059-3066 (2011).
Radamson et al. "Growth of Sn-alloyed Group IV Materials for Photonic and Electronic Applications", Chapter 5 pp. 129-144, Manufacturing NanoStructures.
S.D. Athavale and D.J. Economou, "Realization of Atomic Layer Etching of Silicon", Journal of Vacuum Science and Technology B, vol. 14, year 1996, pp. 3702-3705.
Yun et al., "Behavior of Various Organosilicon Molecules in PECVD Processes for Hydrocarbon-Doped Silicon Oxide Films," Solid State Phenomena, vol. 124-126, 347-350 (2007).
USPTO; Final Office Action dated Sep. 23, 2016 in U.S. Appl. No. 13/187,300.
USPTO; Non-Final Office Action dated Sep. 15, 2016 in U.S. Appl. No. 13/597,108.
USPTO; Notice of Allowance dated Sep. 13, 2016 in U.S. Appl. No. 13/941,216.
USPTO; Final Office Action dated Sep. 20, 2016 in U.S. Appl. No. 13/651,144.
USPTO; Final Office Action dated Aug. 25, 2016 in U.S. Appl. No. 14/188,760.
USPTO; Non Final Office Action dated Aug. 12, 2016 in U.S. Appl. No. 14/246,969.
USPTO; Non-Final Office Action dated Sep. 8, 2016 in U.S. Appl. No. 14/508,296.
USPTO; Final Office Action dated Sep. 29, 2016 in U.S. Appl. No. 14/568,647.
USPTO; Non-Final Office Action dated Sep. 9, 2016 in U.S. Appl. No. 14/829,565.
USPTO; Non-Final Office Action dated Jul. 29, 2016 in U.S. Appl. No. 14/884,695.
USPTO; Non-Final Office Action dated Aug. 12, 2016 in U.S. Appl. No. 14/981,434.
USPTO; Non-Final Office Action dated Sep. 23, 2016 in U.S. Appl. No. 15/048,422.
Becker et al., "Atomic Layer Deposition of Insulating Hafnium and Zirconium Nitrides," Chem. Mater., 16, 3497-3501 (2004).
Nigamananda et al., "Low-Temperature (<200oC) Plasma Enhanced Atomic Deposition of Dense Titanium Nitride Thin Films."
Potts et al., "Low Temperature Plasma-Enhanced Atomic Layer Deposition of metal Oxide Thin Films," Journal of the Electrochemical Society, 157, 66-74 (2010).
Yun et al., "Effect of Plasma on Characteristics of Zirconium Oxide Films Deposited by Plasma-Enhanced Atomic Layer Deposition," Electrochemical and Solid State Letters, 8(11) F47-F50 (2005).

100
PROCESS GAS SUPPLY
GATE VALVE
VACUUM PUMP
ELEVATOR
102
104
106
108
109
110
112
114
116
122
124
126
128
130
132
134
136
138
140
142
144
146
148
150
152

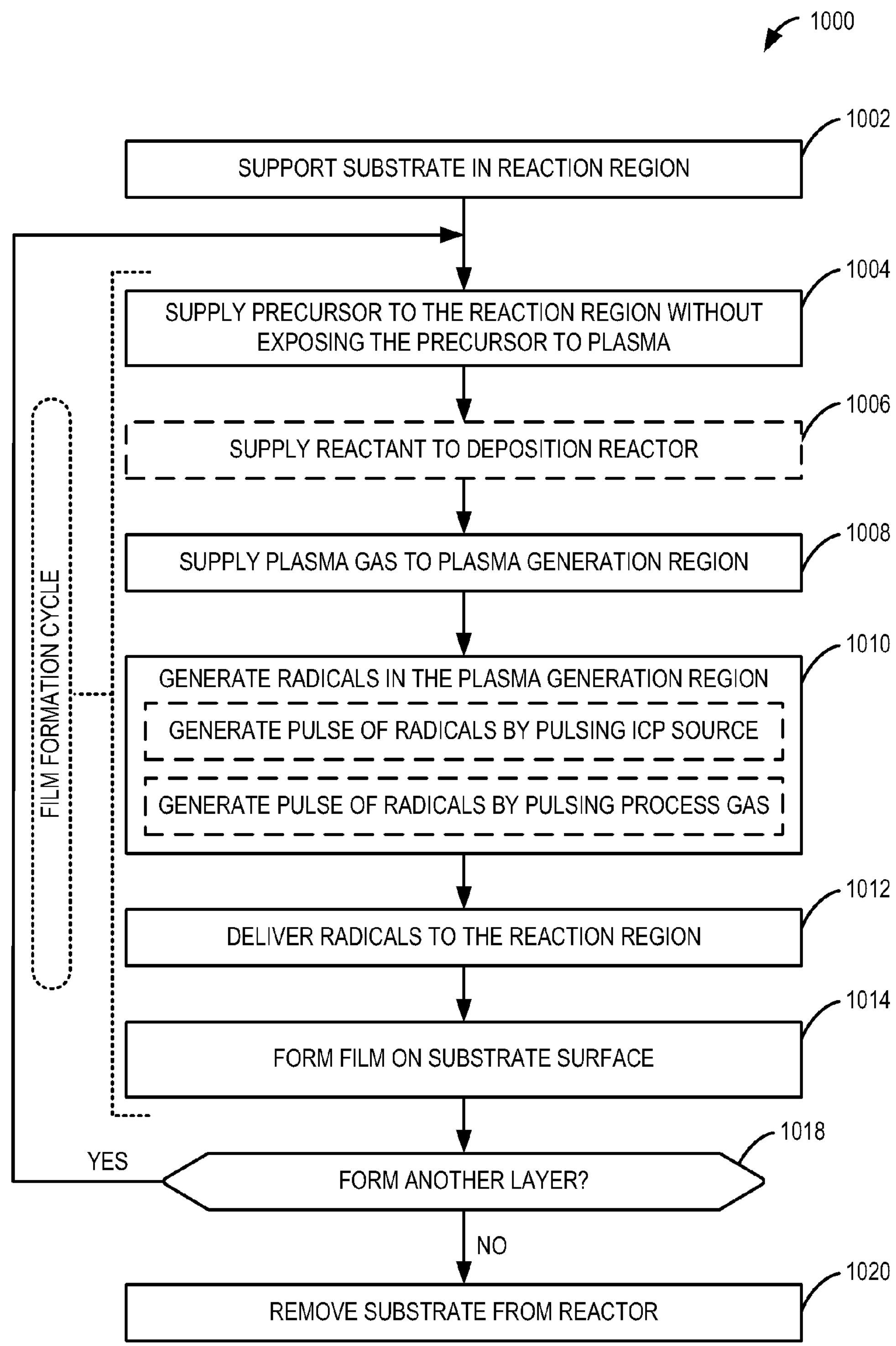
FIG. 10
1000
1002
SUPPORT SUBSTRATE IN REACTION REGION
1004
SUPPLY PRECURSOR TO THE REACTION REGION WITHOUT EXPOSING THE PRECURSOR TO PLASMA
1006
SUPPLY REACTANT TO DEPOSITION REACTOR
1008
SUPPLY PLASMA GAS TO PLASMA GENERATION REGION
1010
GENERATE RADICALS IN THE PLASMA GENERATION REGION
GENERATE PULSE OF RADICALS BY PULSING ICP SOURCE
GENERATE PULSE OF RADICALS BY PULSING PROCESS GAS
FILM FORMATION CYCLE
1012
DELIVER RADICALS TO THE REACTION REGION
1014
FORM FILM ON SUBSTRATE SURFACE
1018
YES
FORM ANOTHER LAYER?
NO
1020
REMOVE SUBSTRATE FROM REACTOR

PROCESS GAS MANAGEMENT FOR AN INDUCTIVELY-COUPLED PLASMA DEPOSITION REACTOR

CROSS-REFERENCE TO RELATED APPLICATIONS

This Application is a continuation of and claims priority to U.S. patent application Ser. No. 13/612,538 entitled "PROCESS GAS MANAGEMENT FOR AN INDUCTIVELY-COUPLED PLASMA DEPOSITION REACTOR," filed Sep. 12, 2012, the disclosure of which is hereby incorporated herein by reference.

BACKGROUND

Some semiconductor fabrication processes have low thermal budgets. For example, some processes used to deposit films after the formation of the first metal interconnect layer may be deposited at a low temperature to avoid electromigration of the metal and potential damage to the device. Thus, thermal activation of some deposition reactions may be difficult under such conditions. Some previous approaches have attempted to employ easily decomposed molecules as starting points for film formation. However, these chemicals can be difficult to handle and may still suffer from low deposition rates. Other approaches have attempted to accelerate deposition using plasma energy. However, some devices may be sensitive to plasma damage under such conditions and some molecules may undergo undesirable reactions when exposed to plasma energy.

SUMMARY

Various embodiments are disclosed herein that relate to hardware and methods for processing a semiconductor substrate. In one embodiment, a film deposition reactor including an inductively-coupled plasma (ICP) comprises a process gas distributor including a plasma gas-feed inlet located to supply plasma gas to a plasma generation region within the film deposition reactor and a precursor gas-feed inlet located to supply film precursor gas downstream of the plasma generation region. The example film deposition reactor also includes an insulating confinement vessel configured to maintain a plasma generation region at a reduced pressure within the film deposition reactor and an ICP coil arranged around a portion of a sidewall of the insulating confinement vessel and positioned so that the sidewall separates the plasma generation region from the ICP coil. The example film deposition reactor further includes a susceptor configured to support the semiconductor substrate so that a film deposition surface of the semiconductor substrate is exposed to a reaction region formed downstream of the process gas distributor.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 10 shows a flowchart for an example method of processing a semiconductor substrate according to an embodiment of the present disclosure.

DETAILED DESCRIPTION

Figure 1:
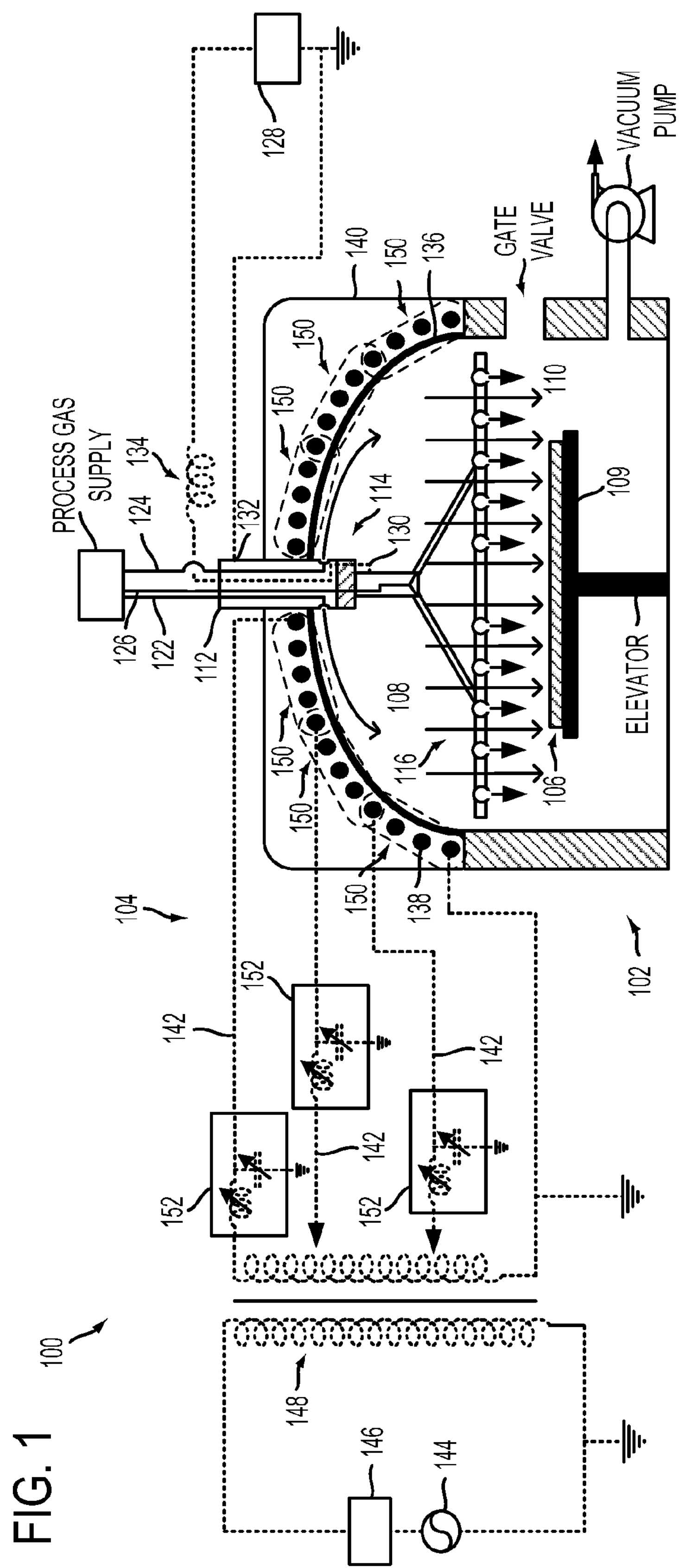
FIG. 1 schematically shows an example film deposition process reactor according to an embodiment of the present disclosure.

Semiconductor devices may include thin films formed by various deposition techniques. Chemical vapor deposition (CVD) and atomic layer deposition (ALD) processes are sometimes used to deposit films used in semiconductor device fabrication processes. In some settings, thermal budget considerations may affect film formation conditions. For example, supplying thermal energy suitable to activate some molecular decomposition processes in CVD or ALD processes may alter device performance depending on a particular manufacturing stage where the deposition process is to be used.

In response, some deposition processes activate using a plasma. For example, radicals formed from a suitable plasma gas may react with species already chemisorbed on the semiconductor substrate, or radical species may themselves chemisorb to the substrate. However, plasma activation may present challenges for some processes. For example, reactant molecules adsorbed to other surfaces in the reactor may be activated by the radicals. Such activation may potentially lead to film accumulation and/or particle formation on those surfaces that may cause defects in the device and/or the processing tool.

Accordingly, the disclosed embodiments relate to hardware and methods for processing a semiconductor substrate. In one embodiment, a film deposition reactor including an inductively-coupled plasma (ICP) comprises a process gas distributor including a plasma gas-feed inlet located to supply plasma gas to a plasma generation region within the film deposition reactor and a precursor gas-feed inlet located to supply film precursor gas downstream of the plasma generation region. The example film deposition reactor also includes an insulating confinement vessel configured to maintain a plasma generation region at a reduced pressure within the film deposition reactor and an ICP coil arranged around a portion of a sidewall of the insulating confinement vessel and positioned so that the sidewall separates the plasma generation region from the ICP coil. The example film deposition reactor further includes a susceptor configured to support the semiconductor substrate so that a film deposition surface of the semiconductor substrate is exposed to a reaction region formed downstream of the process gas distributor.

Thus, harnessing plasma energy to activate/enhance deposition reactions may avoid some performance-altering effects that may result from thermal activation. Introducing plasma-sensitive precursors downstream of a plasma generation region may prevent unwanted reaction of those precursors. For example, gas phase reactions or condensed phase reactions of plasma-sensitive precursors may potentially be avoided by the gas distribution schemes disclosed herein. In turn, film formation may be focused on the exposed substrate instead of various surfaces of the reactor, such as surfaces within the plasma generation region. Film deposited on such surfaces may cause Faraday shielding of plasma generation hardware, clogging in gas distribution nozzles, and/or the generation of small particles that may be transported to the substrate surfaces.

FIG. 1 schematically shows an embodiment of a semiconductor processing module 100 for processing a semiconductor substrate 106. Semiconductor processing module 100 includes a film deposition reactor 102 and an ICP system 104 comprising an RF power source and an ICP coil. Film deposition reactor 102 is configured to deposit one or more thin films on substrate 106 under low pressure conditions. For example, a plasma generated in a plasma generation region 108 is used to produce radicals. In turn, those radicals are supplied to substrate 106 for deposition of a selected film.

In the example shown in FIG. 1, substrate 106 is shown supported on a susceptor 109, which may be heated by a heater to provide thermal energy to substrate 106 in some embodiments. Further, in some embodiments, susceptor 109 may be raised or lowered by an elevator so that substrate 106 may be transferred in and out of reactor 102 and positioned within reaction region 110.

Film deposition reactor 102 includes a process gas distributor 112 configured to deliver gases suitable for direct plasma activation to plasma generation region 108 while delivering one or more other process gases to reaction region 110 without exposing them to plasma conditions. For example, process gas distributor 112 may supply one or more plasma gases and, in some embodiments, one or more reactant gases, to plasma generation region 108. Process gas distributor 112 may also supply one or more plasma-sensitive precursor gases to reaction region 110.

As used herein, a precursor gas refers to a plasma-sensitive process gas (e.g., process gases that may undergo undesirable reactions when exposed to plasma conditions, potentially leading to particle generation in some cases) that contributes matter to a film formed on a substrate in a film forming reaction. In some examples, precursor gases may include various metal-organic or metal-halide compounds having ligands that may easily be eliminated upon exposure to plasma energy. Process gases that are comparatively less sensitive to plasma conditions and that may either contribute to plasma generation (e.g., a plasma gas) or that may be desirably activated by a plasma, such as some reactant gases that may participate in film-forming reactions, may be supplied to reaction region 110 directly or from an upstream location. In turn, radicals and plasma-sensitive process gases may be supplied to reaction region 110 so that film deposition processing may proceed while potentially undesirable plasma-mediated reactions of the precursor gases may be mitigated.

Figure 2:
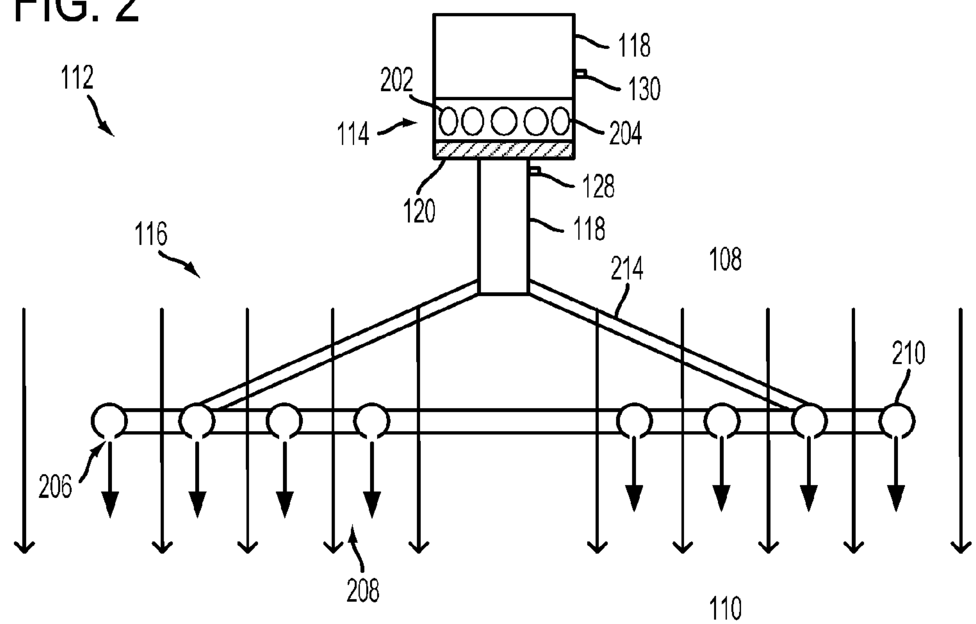
FIG. 2 schematically shows a cross-section of an example process gas distributor assembly according to an embodiment of the present disclosure.

FIG. 2 schematically shows an embodiment of a process gas distributor 112 for use with film deposition reactor 102. In the embodiment shown in FIG. 2, process gas distributor 112 includes a plasma gas distributor 114 and a precursor gas distributor 116. The gas distributors are supported by a support structure 118 and electrically separated from one another by an insulator 120 as described in more detail below. While the embodiment shown in FIG. 2 depicts a process gas distributor 112 that may be assembled from tube-style subunits (e.g., precursor gas distributor 116 may be fabricated from suitable tubing), it will be appreciated that process gas distributor 112 may be fabricated in any suitable way from any suitable materials.

Plasma gas distributor 114 includes one or more plasma gas-feed inlets 202. Plasma gas-feed inlets 202 are positioned to supply plasma gas to plasma generation region 108 within film deposition reactor 102. Any suitable configuration/orientation of plasma gas-feed inlets 202 may be employed without departing from the scope of the present disclosure. For example, in some embodiments, plasma gas-feed inlets 202 may be configured to contribute to the formation of a desired flow regime within plasma generation region 108. For example, a laminar flow regime may be generated within plasma generation region 108 to discourage formation of backflow and/or eddy currents that might dislodge and circulate small particles toward substrate 106 or that might cause precursor gas to be directed toward plasma generation region 108. In some embodiments, plasma gas-feed inlets 202 may be radially arranged, as shown in FIG. 2, or angled, or otherwise suitably oriented to direct exiting plasma gas within plasma generation region 108. Moreover, in some embodiments plasma gas-feed inlets 202 may include suitable nozzles, reducers and/or expanders to adjust the velocity of the exiting plasma gas.

Plasma gas is supplied to plasma gas-feed inlets 202 via one or more plasma gas supply lines (see plasma gas supply line 122 in FIG. 1). In some embodiments, plasma gas supply lines 122 may be arranged within support structure 118. Including gas supply lines within support structure 118 may protect the gas lines from damage during maintenance operations. Further, in some settings, the adventitious formation of conductive films on some gas lines may lead to unintended electrical leakage across insulator 120. Locating the gas lines within support structure 118 may prevent such film formation on the gas lines.

In some embodiments, plasma gas distributor 114 may include one or more reactant gas-feed inlets 204 positioned to supply reactant gas to plasma generation region 108. Reactant gas may be delivered to reactant gas-feed inlets 204 via a reactant gas supply line (see reactant gas supply line 124 in FIG. 1). In some embodiments, precursor gas supply lines 126 may be included within support structure 118. In some embodiments, reactant gas may be supplied to plasma generation region 108 via one or more plasma gas-feed inlets 202. In such embodiments, reactant gas may be supplied to plasma gas-feed inlets 202 via a dedicated reactant gas supply line or by feeding reactant gas through plasma gas supply lines 122.

Precursor gas distributor 116 includes a plurality of precursor gas-feed inlets 206 and a plurality of plasma pass-throughs 208. Precursor gas-feed inlets 206 are provided so that precursor gas is directed toward reaction region 110, and ultimately an exposed surface of substrate 106. Similarly, plasma pass-throughs 208 are openings provided in precursor gas distributor 116 so that radicals may be delivered to reaction region 110.

Plasma pass-throughs 208 deliver radicals generated in plasma generation region 108 to reaction region 110. It will be appreciated that plasma passthroughs 208 of any suitable size may be included in any suitable number without departing from the scope of the present disclosure.

In some embodiments, a critical dimension for one or more plasma pass-throughs 208 may be sized in view of one or more dimensionless values reflective of flow and/or molecular kinetic conditions in an environment near precursor gas distributor 116 and/or within a plasma pass-through. As used herein, a critical dimension refers to a dimension that may be used during a design phase for precursor gas distributor 116. The dimension is not intended to be a limiting dimension in any sense, but is described here for discussion purposes. In other words, the value may not be critical to the operation or function of the distributor or any other hardware disclosed herein. Instead, the critical dimension may serve as a reference value for other dimensions during design and fabrication.

In some embodiments, a critical dimension for one or more plasma pass-throughs 208 may be sized in view of the Mach number of the fluid. The Mach number is a dimensionless number relating the velocity of the radical to the speed of sound in the fluid the radical is traveling in at that pressure and temperature. Mach number may be expressed as:

$$M = \frac{V}{c(T, P)}$$

where M is the Mach number, V is the fluid velocity, and c is the speed of sound for that fluid as a function of temperature and pressure. Without wishing to be bound by theory, a radical characterized with a higher Mach number may be less likely to be quenched while traveling through plasma pass-through 208 via collision relative to a radical characterized with a lower Mach number. This may result from a comparative probabilities of surface collisions or intermolecular collisions associated with the radicals.

In some embodiments, a critical dimension for one or more plasma pass-throughs 208 may be sized at least in part in view of the Knudsen number. The Knudsen number is a dimensionless number relating the mean free path of the radical to a characteristic physical dimension (e.g., the critical dimension) of the plasma passthrough expressed by:

$$Kn = \frac{\lambda}{l}$$

where Kn is the Knudsen number, λ is the critical dimension of plasma pass-through 208, and l is the radical mean free path. Put another way, plasma pass-throughs 208 may be sized so that so that a radical is unlikely to be quenched by a collision with a wall or surface defining a portion of a particular plasma pass-through 208 while traveling through it. In some conditions, the mean free path between collisions with plasma pass-through 208 may be approximated by a mean free path with respect to collision with another molecule or radical, as defined by:

$$l = \frac{k_B T}{\sqrt{2}\,\pi d^2 P}$$

where l is the mean free path, k is the Boltzmann constant, T is the temperature, d is the radical diameter, and P is the local pressure within that particular plasma passthrough 208. As Kn increases in magnitude, surface effects from sidewalls of plasma pass-through 208 may increase with respect to the mean free path of the radicals. Conversely, radical passage through plasma pass-through 208 may become more ballistic as Kn decreases in magnitude. Thus, in some embodiments, λ may be determined based at least in part on a selected Knudsen number.

It will be appreciated that the critical dimensions referred to above may include any suitable dimension that affects flow through plasma pass-throughs 208. For example, in some embodiments, a critical dimension may be a minor dimension or a minimum dimension for a plasma pass-through 208 in one direction. A critical dimension may represent the vertical dimension of the gap through which radicals pass towards the wafer, as shown in 116 of FIG. 2 and 610 of FIGS. 6 and 7. Alternatively, the critical dimension may be regarded as the horizontal gap shown in the same figures. It will be appreciated that the ratio of the vertical gap to the horizontal gap constitutes a dimensionless aspect ratio, which may be an important consideration, as a high aspect ratio constitutes greater restriction and greater radical recombination loss than a gap with low aspect ratio.

Further, it will be appreciated that different plasma pass-throughs 208 may have different sizes according to positioning within precursor gas distributor 116. For example, in some embodiments, plasma pass-throughs 208 positioned farther from a center of precursor gas distributor 116 may have a larger opening relative to plasma pass-throughs 208 positioned closer to the center. Variation in plasma passthrough size (e.g., radial dependence in some embodiments) may compensate for upstream flow variation, such as in embodiments where a laminar flow profile exists upstream. For example, a laminar flow distribution in plasma generation region 108 may be reshaped toward a plug-flow distribution in reaction region 110.

Regardless of how plasma pass-throughs 208 are shaped and/or sized in precursor gas distributor 116, it will be appreciated that factors other than radical lifetime may be considered in some embodiments. For example, pass-throughs may be shaped and sized so that radical flow through the reactor is substantially unidirectional (e.g., from plasma generation region 108 toward reaction region 110) to avoid backstreaming of radicals and other process gases, including various plasma-sensitive precursors. It will be appreciated that optimal gas flow may be effected by a slight pressure differential between the top and bottom of the showerhead. A slight pressure differential may help equalize flow across the diameter of the showerhead. However, a design to increase pressure differential may be balanced against a potential need to have a high proportion of the radicals surviving through the showerhead gaps.

Precursor gas distributor 116 also includes a plurality of precursor gas-feed inlets 206 that distribute precursor gas to reaction region 110 downstream of plasma generation region 108. Because the local flow of precursor gas may affect the film formation rate for that locality, in some embodiments, individual precursor gas-feed inlets 206 may be positioned and/or sized/shaped so that precursor gas has a selected flow profile toward substrate 106.

For example, in some embodiments, a radial distribution (with respect to a central axis of process gas distributor 112) of the number and/or size of precursor gas-feed inlets 206 may be selected to achieve a uniform flow (within an acceptable tolerance) of precursor at the outlet, within reaction region 110, and/or at an exposed surface of substrate 106. Assuming that a central point of substrate 106 is aligned with a central axis of process gas distributor 112, such a flow condition may enhance within-substrate film thickness uniformity. Of course, it will be understood that any suitable flow profile may be created to adjust any suitable film property, including bulk properties, interfacial properties, electrical properties, physical properties, and so on.

Figure 3:
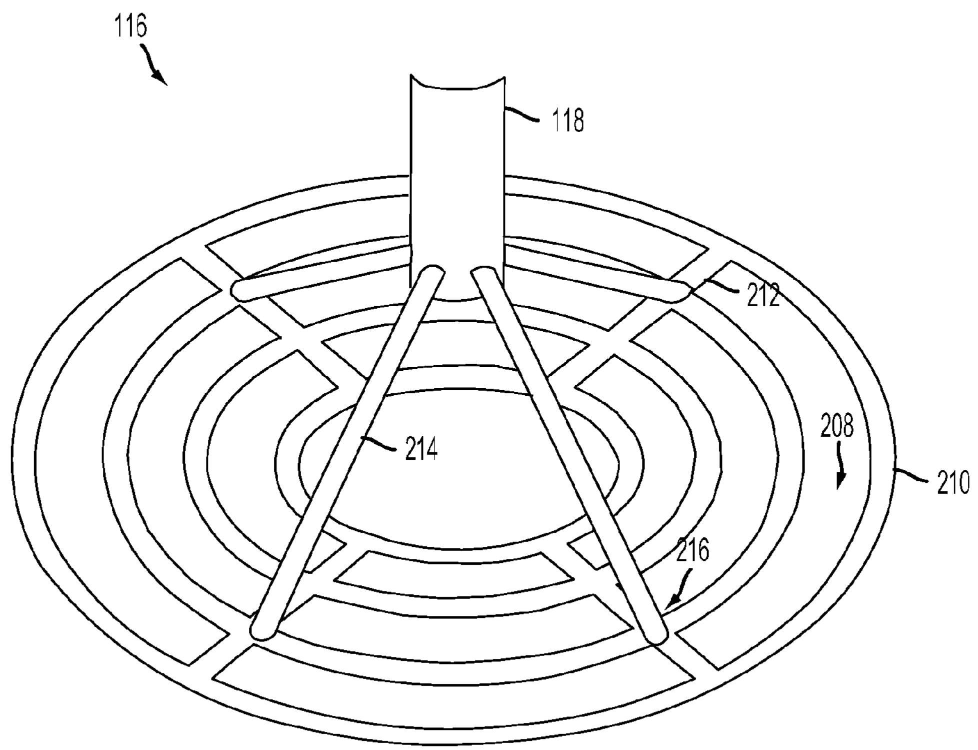
FIG. 3 schematically shows a perspective view of an example precursor gas distributor included in the process gas distributor illustrated in FIG. 2.

Precursor is supplied to precursor gas-feed inlets 206 via suitable gas distribution structures fluidly coupled with one or more precursor gas supply lines (see precursor gas supply line 126 in FIG. 1). In some embodiments, precursor gas supply lines 126 may be included within support structure 118. In the embodiment shown in FIG. 2, precursor gas distributor 116 includes a plurality of azimuthal precursor gas distributors 210 and a plurality of radial precursor gas distributors 212. FIG. 3 schematically shows a top perspective view of the embodiment of precursor distributor 116 shown in FIG. 2, and illustrates these structures with respect to one another and to plasma pass-throughs 208.

In the example shown in FIGS. 2 and 3, these distributors are configured so that precursor gas-feed inlets 206 may be arranged concentrically around support structure 118. Precursor gas-feed inlets 206 may be included in either or both of these distributors. So arranged, precursor gas may be distributed to reaction region 110 and the exposed surface of substrate 106 without substantially changing the flow direction of the radicals and/or plasma gas flowing through the reactor. Because alterations of flow may lead to defect generation and/or to thickness non-uniformity in some settings, the flow conditions depicted in FIGS. 2 and 3 (e.g., in a substantially downward direction) may reduce defect inclusion and/or thickness excursion potential during substrate processing.

In the example shown in FIGS. 2 and 3, each of a plurality of gas distribution arms 214 delivers a portion of the precursor gas from a precursor gas supply line included in support structure 118 to azimuthal precursor gas distributors 210 and radial precursor gas distributors 212 at a precursor gas entry location 216 positioned between a center and an outer edge of the precursor gas distributor 116. Dividing the precursor flow upstream of the gas entry location and delivering it as shown may help overcome pressure drop within azimuthal precursor gas distributors 210 and/or radial precursor gas distributors 212, potentially enhancing distribution efficiency to reaction region 110.

Figure 4:
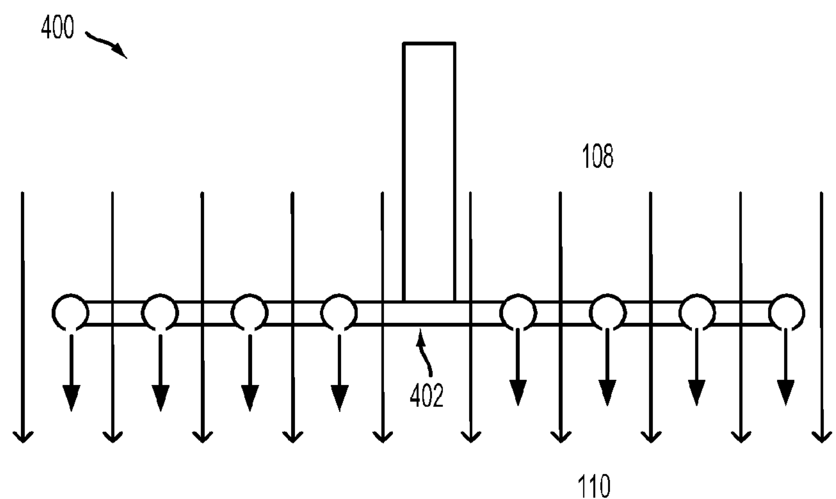
FIG. 4 schematically shows a cross-section of another example precursor gas distributor according to an embodiment of the present disclosure.
Figure 5:
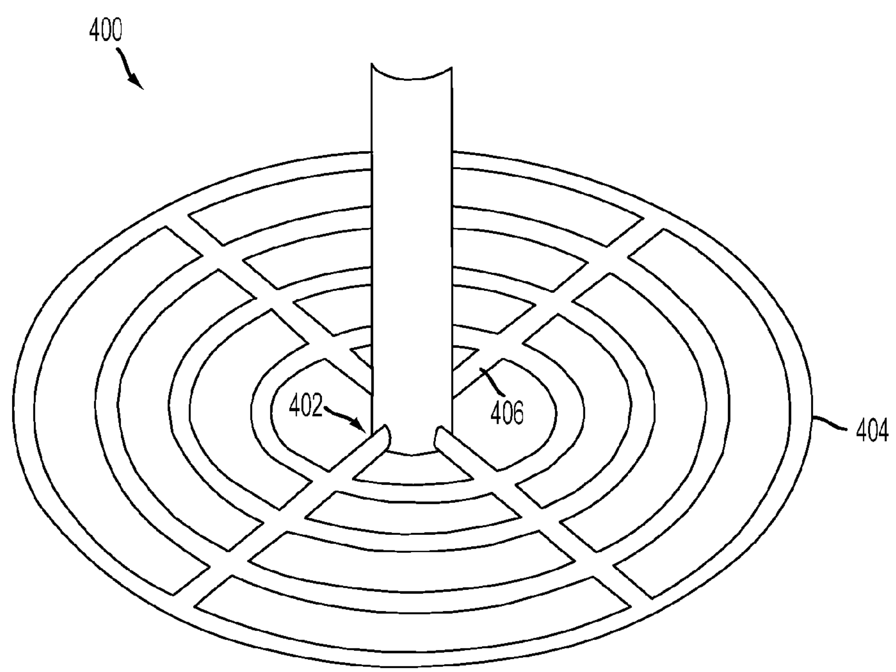
FIG. 5 schematically shows a perspective view of the example precursor gas distributor shown in FIG. 4.

It will be appreciated that any suitable precursor gas distributor may be employed without departing from the scope of the present disclosure. For example, FIG. 4 schematically shows a cross-sectional view of another embodiment of a precursor gas distributor 400, and FIG. 5 schematically shows a top perspective view of precursor gas distributor 400 as shown in FIG. 4. In the example shown in FIGS. 4 and 5, precursor gas is supplied at a precursor gas entry location 402 position at a center of precursor gas distributor 400. Supplying precursor gas from a central location may provide a simple, robust approach to distributing precursor gas using a less complex precursor gas distributor relative to the example shown in FIGS. 2 and 3. Once supplied from the central location, precursor gas is distributed via precursor gas-feed inlets that may be included in azimuthal precursor gas distributors 404 and/or radial precursor gas distributors 406.

Figure 6:
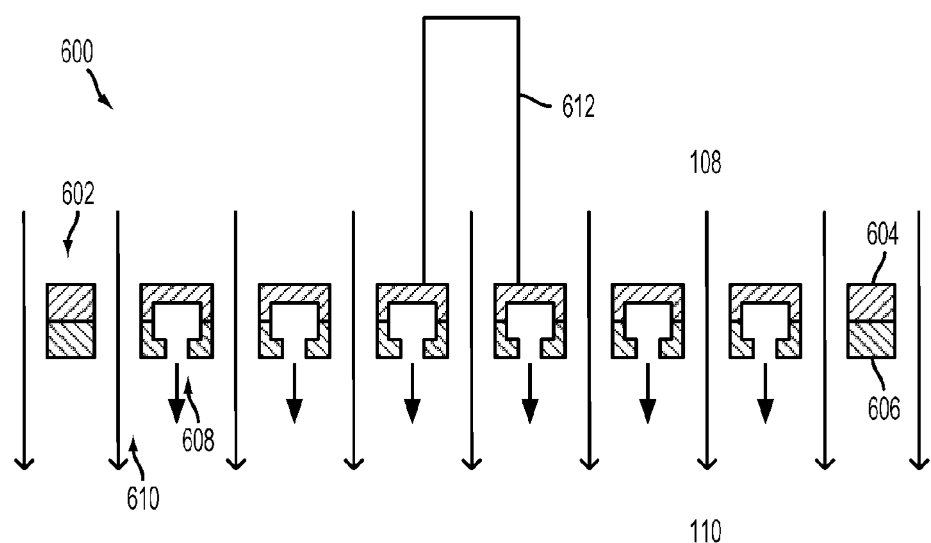
FIG. 6 schematically shows a cross-section of another example precursor gas distributor according to an embodiment of the present disclosure.
Figure 7:
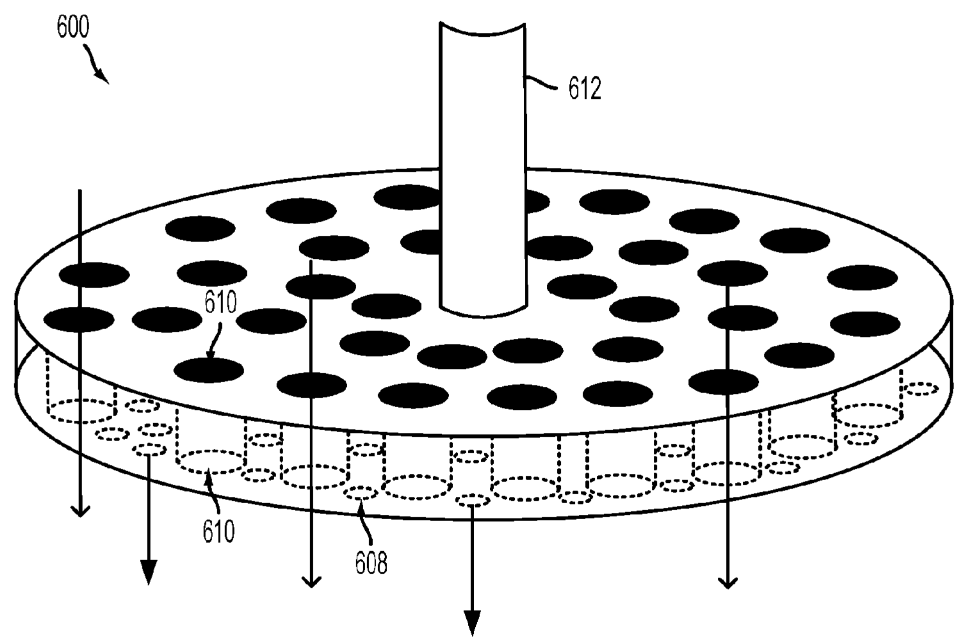
FIG. 7 schematically shows a perspective view of the example precursor gas distributor shown in FIG. 6.

As yet another example, FIG. 6 schematically shows a cross-section of an embodiment of a precursor gas distributor 600 that includes a no-mix showerhead assembly 602. FIG. 7 schematically shows a top perspective view of the embodiment of precursor gas distributor 600 shown in FIG. 6. As shown in FIG. 6, no-mix showerhead assembly 602 includes a top structure 604 and a bottom structure 606. When assembled, these structures form a plurality of precursor gas-feed inlets 608 and a plurality of plasma pass-throughs 610. No-mix showerhead assembly 602 is supported by support structure 612 so that precursor gas is introduced downstream of plasma generation region 108 (see FIG. 1). In the example shown in FIGS. 6 and 7, precursor gas is supplied from a precursor gas supply line included in support structure 612. Precursor gas distribution channels within no-mix showerhead assembly 602 route the precursor gas to precursor gas-feed inlets 608 for distribution to reaction region 110.

It will be appreciated that precursor gas may also be distributed via a showerhead configured to mix precursor gas and plasma/radical gases prior to delivery to reaction region 110 in some embodiments. For example, such mixing may take place within a suitable mixing showerhead but downstream of plasma generation region 108.

In some embodiments, precursor gas distributor 116 may include one or more reactant gas-feed inlets positioned to supply reactant gas to reaction region 110. Reactant gas may be delivered to such reactant gas-feed inlets via a reactant gas supply line or by feeding reactant gas through another suitable supply line, either of which may be included within support structure 118 in some embodiments.

Turning back to FIG. 2, plasma gas distributor 114 and precursor gas distributor 116 are supported by support structure 118. In the example shown in FIG. 2, support structure 118 co-axially supports plasma gas distributor 114 and precursor gas distributor 116, so that precursor gas distributor 116 extends from plasma gas distributor 114 along a common axis. Thus, in the embodiment shown in FIG. 2, process gas distributor 112 is supported from above by reactor 102 so that a gap is formed between precursor gas distributor 116 and a sidewall of reactor 102 (see FIG. 1). This may help maintain electrical isolation of precursor gas distributor 116 when screening ions as described in more detail below. While not shown in FIG. 1 or FIG. 2, it will be appreciated that one or more supplementary supports may be provided to brace precursor gas distributor 116 and/or process gas distributor 112 in some embodiments. For example, in one scenario one or more insulating braces may be provided at a circumferential edge of precursor gas distributor 116. Such braces may maintain an electrical and flow gap while aiding in the structural support of process gas distributor 112.

Centrally supporting the gas distributors may also position a central axis of process gas distributor 112 over a center of substrate 106. In turn, radial gas distribution into reaction region 110 and onto an exposed surface of substrate 106 may be comparatively enhanced relative to examples where one or more of the plasma or precursor gases are introduced from a side position. Put differently, directing the precursor gas within precursor gas distributor 116 to flow radially outward from the centrally-positioned support structure 118 toward an edge of precursor gas distributor 116 may enhance precursor gas distribution above the surface of substrate 106. In contrast, side injection of a gas into the gas distributor may lead to a non-uniform pressure distribution within the distributor. In turn, less gas may exit a side of the distributor away from the side injector relative to an exit position closer to the side injector. Substrate thickness and/or particle distribution may track the distribution non-uniformity in some processes, potentially leading to wedge-shaped thickness profiles and/or particle sprays. By providing gas flow to plasma gas distributor 114 and precursor gas distributor 116 relative to a centrally-positioned support structure 118, the disclosed embodiments may enhance radial gas distribution uniformity relative to a center of process gas distributor 112. In turn, the gas distribution profiles disclosed herein may be translated into radial uniformity relative to a center position of substrate 106.

Support structure 118 also includes an electrical insulator 120 disposed between plasma gas distributor 114 and precursor gas distributor 116 to accommodate a voltage difference between those distributors. Providing a voltage difference between the gas distributors may cause precursor gas distributor 116 to act as an ion filter for plasma generation region 108. In turn, radicals may be supplied to reaction region 110 while ions are filtered out, potentially reducing ion bombardment damage to substrate 106. In the embodiment shown in FIG. 1 bias source 128 is electrically coupled with precursor gas distributor 116 via a first electrical connection 130 and with plasma gas distributor 114 via a second electrical connection 132.

For example, FIG. 1 shows a bias source 128 adapted to establish a voltage difference between plasma gas distributor 114 and precursor gas distributor 116. Ions generated in plasma generation region 108 may be collected by precursor gas distributor 116. In some embodiments, bias source 128 may include a suitable DC power supply. In some other embodiments, bias source 128 may be a ground.

In some embodiments, a choke 134 may be electrically coupled with bias source 128. Choke 134 may prevent radio frequency energy from entering and damaging bias source 128. It will be appreciated that suitable choke(s) may be included in other power sources, gas lines, cooling lines, and so on to mitigate RF leakage as described herein.

The example film deposition reactor also includes an insulating confinement vessel 136 configured to separate plasma generation region 108 from ambient conditions. Thus, insulating confinement vessel 136 may act with a vacuum source (see FIG. 1) so that plasma generation region 108 operates at a reduced pressure relative to the ambient. In the example shown in FIG. 1, an ICP coil 138 for inducing a plasma within plasma generation region 108 is arranged around a portion of a sidewall of insulating confinement vessel 136. An electromagnetic shield 140 covers ICP coil 138 to screen electromagnetic fields generated by ICP coil 138 from the ambient environment. Insulating confinement vessel 136 may be formed from any suitable electrically-insulating material. For example, in some embodiments, quartz may be used to form insulating confinement vessel 136, though other dielectric materials may be employed in some embodiments.

Various mass transfer and/or kinetic processes during film formation may lead to radial thickness variation in the formed film or to radial variation in some other property (e.g., density, refractive index, etc.). Thus, in some film formation processes, it may be helpful to vary the radial density of radicals within reaction region 110. In some embodiments, the radial distribution of radicals may be adjusted by adjusting flow dynamics within plasma generation region 108.

In some embodiments, flow within plasma generation region 108 may be adjusted to form a laminar flow regime. In theory, a laminar flow regime avoids turbulence, so that a fluid element positioned away from a boundary layer may remain at approximately the same radial position within a constant-diameter portion of a flow path. Thus, a laminar flow regime may provide a stable, predictable flow regime for radical transport.

Figure 8:
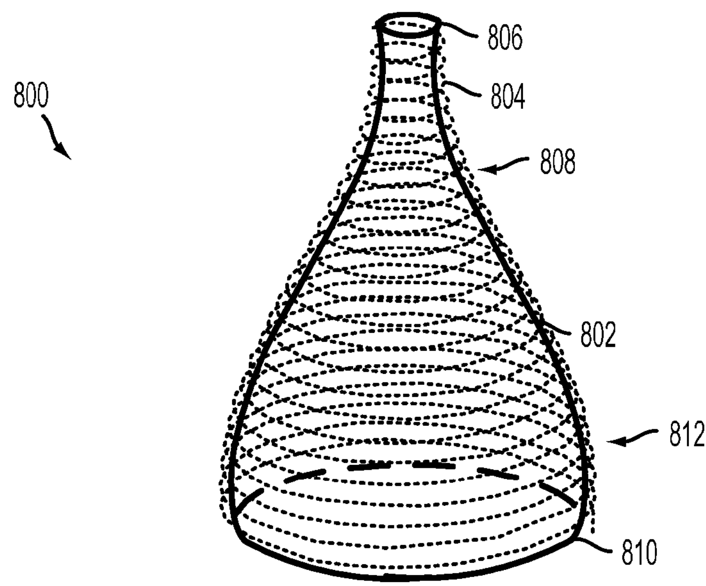
FIG. 8 schematically shows an example of an insulating confinement vessel having a sidewall with a laminar flow profile according to an embodiment of the present disclosure.

In some embodiments, such flow regimes may be created by selective shaping of insulating confinement vessel 136. For example, FIG. 8 illustrates an embodiment of an insulating confinement vessel 800 having a sidewall 802 exhibiting, on a low-pressure face (e.g., a face of sidewall 802 exposed to a low pressure environment such as plasma generation region 108), a profile conducive to forming laminar flow within the vessel under typical flow conditions. In the embodiment shown in FIG. 8, an example ICP coil placement position 804 is shown around an outside surface of sidewall 802 to illustrate that a plasma generation region 108 may be formed therein. In the example shown in FIG. 8, sidewall 802 exhibits a cross-section that curves inward toward a central axis of symmetry near inlet 806 (see 808 in FIG. 2) and then reverses to curve outward near outlet 810 (see 812 in FIG. 2) if viewed in cross-section taken along the central axis. The bottle-shaped vessel illustrated in FIG. 8 may, in some embodiments, enhance radial distribution of radicals so that the flux of radicals toward the exposed surface of substrate 106 may be more evenly distributed across the surface when compared to vessels that do not provide laminar flow regimes.

Figure 9:
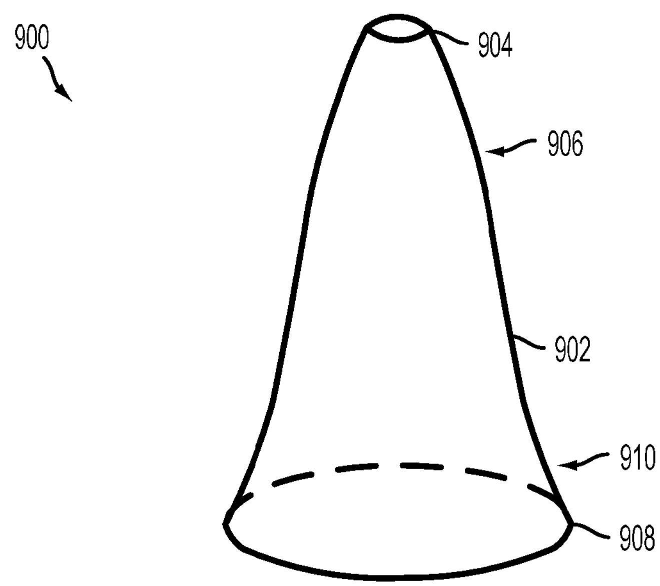
FIG. 9 schematically shows another example of an insulating confinement vessel having a sidewall with a laminar flow profile according to an embodiment of the present disclosure.

As another example, FIG. 9 shows an embodiment of an insulating confinement vessel 900 having a sidewall 902 exhibiting, on a low-pressure face (e.g., a face of sidewall 902 exposed to a low pressure environment such as plasma generation region 108), a profile conducive to forming laminar flow within the vessel under typical flow conditions. For clarity, FIG. 9 does not illustrate an example ICP coil placement position, though it will be appreciated that a plasma generation region 108 may be formed therein. In the example shown in FIG. 9, sidewall 902 exhibits a cross-section that curves outward toward a central axis of symmetry near inlet 904 (see 906 in FIG. 2) and then reverses to curve inward near outlet 908 (see 910 in FIG. 2) if viewed in cross-section taken along the central axis. The horn-shaped vessel illustrated in FIG. 9 may also enhance the radial distribution of radicals so that the flux of radicals toward the exposed surface of substrate 106 may be more evenly distributed across the surface.

It will be appreciated that laminar profiles may be generated with any suitable shape, including vessels having sidewalls with profiles exhibiting intermediate shapes to those shown in FIGS. 8 and 9. For example, in some embodiments, a vessel having a laminar profile may exhibits a cross-section that is monotonic in some aspect (e.g., horn-shaped). In some embodiments, laminar flow regimes may also be created and/or controlled by suitable adjustment of gas flow rates, etc. within the reactor.

It will be appreciated that the radial distribution of radicals may also be adjusted dynamically (e.g., during processing and/or without altering the shape of plasma generation region 108. For example, FIG. 1 depicts ICP coil 138 as a single coil including a plurality of plasma density adjustment taps 142 for varying plasma density within respective plasma generation region 108. Power for generating plasma is supplied to ICP coil 138 from an ICP power source 144 and matching network 146 via a multi-tap transformer 148. Each of the plasma density adjustment taps 142 may be adjusted to vary power within corresponding plasma zones 150. Varying power within each plasma zone 150 changes the generation rate of radicals, effectively altering the radial distribution of radicals within plasma generation region 108.

Use of a single ICP coil 138 with a plurality of plasma density adjustment taps 142 may provide a comparatively less complex approach to varying plasma density relative to systems including a plurality of coils and associated power supplies. Alternatively, in some embodiments, ICP system 104 may include a plurality of independent ICP coils and associated power supplies capable of independently varying plasma density within plasma zones 150.

In the embodiment shown in FIG. 1, each plasma density adjustment tap 142 includes a plasma density tuner 152 used to adjust power in each plasma zone 150. As shown in FIG. 1, plasma density tuners 152 include components used to adjust zone attenuation (for example, via a variable capacitor) and zone phase shift (for example, via a variable inductor). In some embodiments, plasma density tuners 152 may be purely passive/reactive, including no transistors or other active components.

It will be appreciated that the laminar flow regimes discussed above may provide a predictable, stable flow in which radical populations may be adjusted on a zone-by-zone basis in some embodiments. Put differently, radicals may be generated within plasma generation region 108 according to a selected radial distribution. Those radicals may then be moved, with little turbulent mixing, toward reaction region 110 via a suitable laminar flow regime created within the reactor, potentially providing a selected radical distribution at an exposed surface of substrate 106. Meanwhile, precursor gas may also be supplied to an exposed surface of substrate 106 without exposing the precursor gas to plasma generation region 108. In turn, a film may be formed on substrate 106 exhibiting comparatively fewer particle defects and/or exhibiting a selected radial profile of an electrical or physical property.

As an example, FIG. 10 shows a flow chart illustrating an embodiment of a method 1000 of forming a film on a semiconductor substrate in an inductively-coupled plasma (ICP) processing tool. It will be appreciated that embodiments of method 1000 may be performed by any suitable hardware, including the hardware disclosed herein. Further, it will be appreciated that portions of the processes described in method 1000 may be omitted, reordered, and/or supplemented without departing from the scope of the present disclosure.

At 1002, method 1000 includes supporting the semiconductor substrate on a susceptor so that the semiconductor substrate is exposed to a reaction region within an inductively-coupled plasma (ICP) processing tool. In some embodiments, supporting the substrate in the reactor may include adjusting one or more reactor conditions, such as temperature, pressure, and/or carrier gas (e.g., Ar, $N_2$, or He) flow rate, to conditions suitable for film formation prior to processing the substrate. It will be appreciated that such film formation conditions may vary according to film deposition process chemistry, substrate surface termination, and so on.

For example, reactor conditions may be adjusted to facilitate the formation of surface active species from suitable film precursors by activating surface adsorption and decomposition processes. In some scenarios, reactor conditions may be adjusted to avoid gas phase decomposition reactions for one or more process gases, potentially avoiding film contamination from decomposition products and/or poor step coverage resulting from diffusion effects. Further, in some scenarios, reactor conditions may be adjusted to avoid condensation of process gases on various reactor surfaces, potentially avoiding small particle defect generation processes.

In the example shown in FIG. 10, method 1000 enters a film formation cycle after supporting the substrate in the reactor at 1002. As used herein, a film formation cycle refers to a film formation event that includes a single exposure of the precursor to the substrate and a single exposure of radicals to the substrate. It will be appreciated that any suitable adjustments to the reactor conditions may be made during the film formation cycle, including adjustments to temperature, pressure, and/or the flow rates of various gases supplied to the reactor during the film formation cycle. The film formation cycle shown in FIG. 10 includes processes 1004 through 1014. It will be appreciated that the arrangement and order of processes shown in the film formation cycle depicted in FIG. 10 are provided for illustrative purposes only, and may be varied in any suitable way in some embodiments.

At 1004, method 1000 includes supplying precursor gas to the reaction region. Because the precursor may be sensitive to plasma (e.g., because the precursor may undesirably react in the presence of plasma), the precursor is introduced to the reaction region without exposing the precursor to plasma conditions. For example, the precursor may be introduced to the reaction region via a suitable precursor gas distributor. It will be appreciated that the amount of precursor gas supplied to the reaction region may vary depending on, among other factors, the topography of the exposed surface of the substrate, the film formation conditions present in the reaction region, and the adsorption rate and/or the sticking coefficient of the precursor on the surface under those conditions.

Supplying precursor gas to the reaction region at 1004 includes adsorbing reactive precursor intermediates to an exposed surface of the semiconductor substrate. Without wishing to be bound by theory, as the precursor is supplied to the reaction region, gas phase molecules of the precursor may adsorb on the exposed surface of the substrate. Some of the gas phase molecules may become chemically adsorbed (e.g., chemisorbed) to the surface at sites on the surface that activate such chemisorption reactions. Such chemisorbed species may form surface-active intermediate species of the precursor. Because such intermediate species are bound to at least one surface site until a further reaction occurs, adsorption of the precursor may occur in a self-limiting manner. In turn, the film formed during a film formation cycle may be moderated at least in part by the surface reactions of the active species with a subsequently-supplied reactant, as described in more detail below.

After the precursor is supplied to the reaction region and intermediates become adsorbed to the substrate, residual precursor is typically removed. Thus, supplying precursor gas to the reaction region at 1004 may include removing the precursor from the reaction region in some embodiments. Removing the precursor from the reaction region includes removing gas phase molecules of the precursor and molecules of the precursor that are condensed on the surface but that are not chemically adsorbed to it. Such physically adsorbed (e.g., physisorbed) molecules may be condensed on the surface in more than one layer or may be distributed in non-uniform ways (such as being condensed within narrow openings formed in the exposed surface). Removing non-chemisorbed precursor molecules may prevent reaction of such molecules with subsequently-introduced reactant and/or may assist with deposition thickness control. Put another way, removing residual precursor may avoid non-uniform, non-conformal film formation and/or small particle defect generation. It will be appreciated that any suitable approach for removing residual precursor from the reaction region may be employed without departing from the scope of the present disclosure. For example, in some embodiments, the reactor may be evacuated to a base pressure. Additionally or alternatively, in some embodiments, the reactor may be supplied with a suitable displacement gas, such as Ar, $N_2$, or He.

Once chemisorbed to the surface, the precursor intermediates await plasma-activated reaction to complete the film layer. As discussed in more detail below, in some embodiments, the precursor intermediates may react directly with reactant radicals (e.g., plasma-activated reactant formed in a plasma generation region and supplied to the reaction region), while in other embodiments the radicals may themselves chemisorb to the substrate.

Further, in some embodiments, reactant may be supplied to the reaction region and the substrate surface prior to plasma generation and radical delivery, as illustrated at 1006. For example, the reactant gas may be introduced to a plasma generation region via a suitable plasma gas distributor and allowed to flow downstream into the reaction region. In another example, the reactant gas may be introduced to the reaction region via a suitable precursor gas distributor. Once supplied, reactant species may adsorb to the substrate surface. Thus, in some embodiments, supplying reactant to the reaction region may include adsorbing reactive reactant intermediates to the substrate.

If a reactant gas is provided at 1006, in some embodiments, process 1006 may also include removing residual reactant gas. Removing residual reactant may avoid non-uniform, non-conformal film formation and/or small particle defect generation. It will be appreciated that any suitable approach for removing residual reactant from the reaction region may be employed without departing from the scope of the present disclosure. For example, in some embodiments, the reactor may be evacuated to a base pressure. Additionally or alternatively, in some embodiments, the reactor may be supplied with a suitable displacement gas, such as Ar, $N_2$, or He. Alternatively, in some embodiments, reactant gas may remain in the reaction region and/or the plasma generation region in preparation for plasma generation, discussed in more detail below.

Process 1006 may also include removing residual reactant gas. Removing residual reactant may avoid non-uniform, non-conformal film formation and/or small particle defect generation. It will be appreciated that any suitable approach for removing residual reactant from the reaction region may be employed without departing from the scope of the present disclosure. For example, in some embodiments, the reactor may be evacuated to a base pressure. Additionally or alternatively, in some embodiments, the reactor may be supplied with a suitable displacement gas, such as Ar, $N_2$, or He. Alternatively, in some embodiments, reactant gas may remain in the reaction region and/or the plasma generation region in preparation for plasma generation, discussed in more detail below.

At 1008, method 1000 includes supplying a plasma gas to the plasma generation region, and, at 1010, generating radicals from the plasma gas in the plasma generation region so that a pulse of radicals is generated with the plasma. In one non-limiting example, plasma power may be cycled on and off to create a radical pulse. In another example, a plasma may be maintained in the plasma generation region while a selected plasma gas and/or reactant gas is pulsed into the plasma generation region to generate a radical pulse.

It will be appreciated that plasma gas may be introduced to the plasma generation region in any suitable way. For example, the plasma gas may be introduced to the plasma generation region via a suitable plasma gas distributor. Further, any suitable plasma gas may be supplied. Non-limiting examples include Ar, $H_2$, and He.

It will also be appreciated that any suitable manner of generating a plasma may be employed without departing from the scope of the present disclosure. For example, a suitable ICP source and coil may be used to strike a plasma in the plasma generation region. In some embodiments, plasma density during radical generation may be adjusted within the plasma generation region via one or more plasma density adjustment taps electrically coupled with the ICP coil or by varying power supplied to independent ICP coils. Adjustment of the plasma density in plasma zones may provide an approach to adjusting radial plasma density within the plasma generation region and within the reaction region downstream. Further, in some embodiments, ions generated during plasma generation may be filtered using a suitable ion filter. For example, the precursor gas distributor described above may be used with a bias source to filter ions from the gas stream. Collecting the ions may avoid potential ion bombardment damage to the substrate surface.

In some embodiments, reactant radicals may be generated from reactant gas present in/supplied to reaction region during plasma generation. In other words, a non-reactive plasma may be used to generate reactant radicals for delivery to the substrate surface and subsequent reaction with the precursor intermediates adsorbed thereon. In some embodiments, radicals from a reactive plasma (e.g., a reactive plasma gas) may be supplied to the substrate surface for reaction.

At 1012, method 1000 includes delivering radicals to the reaction region. For example, radicals may be delivered to the reaction region via plasma passthroughs included in a precursor gas distributor like those described herein. Once delivered to the reaction region, the radicals react with surface-adsorbed intermediates to form a layer of film. Thus, method 1000 includes, at 1014, forming film on the substrate surface. In some embodiments, forming the film may include reacting radicals with precursor intermediates adsorbed to the exposed surface to form the film. For example, radicals may react directly with adsorbed precursor intermediates to form a film layer. In some other embodiments, forming the film may include reacting radicals with precursor intermediates and reactant intermediates adsorbed to the exposed surface to form the film. For example, radicals may activate a reaction between adsorbed reactant and precursor intermediates on the surface. In still other embodiments, forming the film may include activating gas phase reactions between the radicals and gas phase reactant in the reaction region that trigger surface reactions with surface-adsorbed precursor intermediates.

After forming the film, in some embodiments, the plasma power may be switched off and residual radicals may be removed from the plasma generation region and the reaction region. It will be appreciated that any suitable approach for removing residual plasma gas may be employed without departing from the scope of the present disclosure. For example, in some embodiments, the reactor may be evacuated to a base pressure. Additionally or alternatively, in some embodiments, the reactor may be supplied with a suitable displacement gas, such as Ar, $N_2$, or He. Alternatively, in some embodiments, plasma gas may remain in the reactor while the plasma power is switched off.

Because the film layer may be formed via a self-limiting adsorption and reaction process, in some embodiments, each film formation cycle may yield a predictable thickness of film, within an acceptable tolerance. Consequently, in some of such embodiments, any suitable thickness of film may be formed by repeating the film formation cycle a suitable number of times. Thus, method 1000 includes, at 1018, determining whether to form another layer of film. If another layer is to be formed, method 1000 returns to 1004; if not, film formation is completed and the substrate is removed from the reactor at 1020.

While method 1000 generally describes an atomic layer deposition film formation process, it will be appreciated that any suitable film formation process may be employed without departing from the scope of the present disclosure. In some embodiments, the layer-by-layer film formation process provided by plasma-enhanced ALD (PEALD) may permit precise, predictable control of film thickness. However, in some embodiments, plasma-enhanced chemical vapor deposition (PECVD) may be employed, as PECVD techniques typically form films at a relatively faster deposition rate than PEALD processes.

Figure 11:
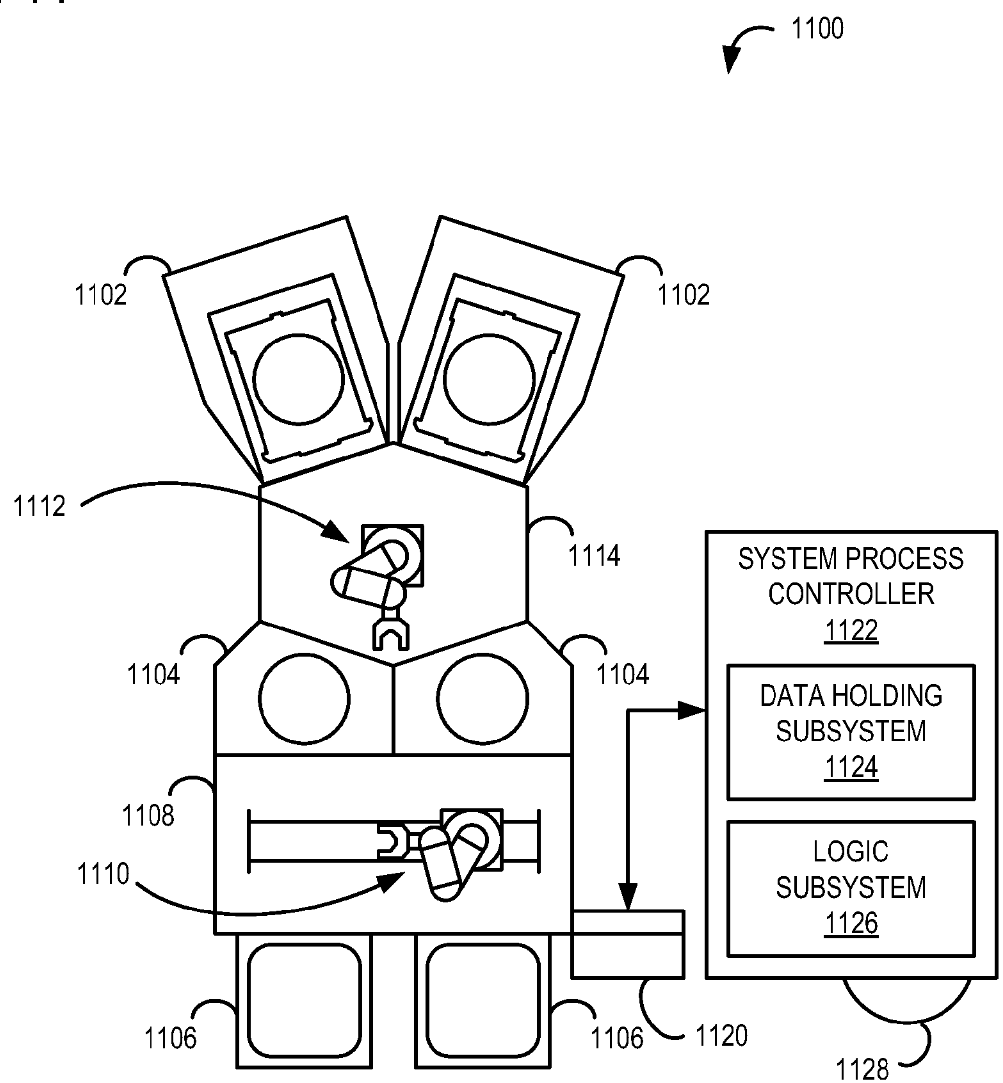
FIG. 11 schematically shows, according to an embodiment of the present disclosure, an example of a semiconductor processing tool including one or more film deposition process reactors.

In some embodiments, the film deposition reactors and the methods of forming films described herein may be formed using a suitable semiconductor processing tool. FIG. 11 schematically shows a top view of an embodiment of a semiconductor processing tool 1100 including a plurality of semiconductor processing modules 1102. While the depicted embodiment includes two modules, it will be appreciated that any suitable number of semiconductor processing modules may be provided. For example, some processing tools may include just one module while other processing tools may include more than two modules.

FIG. 11 also shows load locks 1104 for moving substrates between portions of semiconductor processing tool 1100 that exhibit ambient atmospheric pressure conditions and portions of the tool that are at pressures lower than atmospheric conditions. An atmospheric transfer module 1108, including an atmospheric substrate handling robot 1110, moves substrates between load ports 1106 and load locks 1104, where a portion of the ambient pressure is removed by a vacuum source (not shown) or is restored by backfilling with a suitable gas, depending on whether substrates are being transferred into or out of the tool. Low-pressure substrate handling robot 1112 moves substrates between load locks 1104 and semiconductor processing modules 1102 within low-pressure transfer module 1114. Substrates may also be moved among the semiconductor processing modules 1102 within low-pressure transfer module 1114 using low-pressure substrate handling robot 1112, so that sequential and/or parallel processing of substrates may be performed without exposure to air and/or without a vacuum break.

FIG. 11 also shows a user interface 1120 connected to a system process controller 1122. User interface 1120 is adapted to receive user input to system process controller 1122. User interface 1120 may optionally include a display subsystem, and suitable user input devices such as keyboards, mice, control pads, and/or touch screens, for example, that are not shown in FIG. 11.

FIG. 11 shows an embodiment of a system process controller 1122 provided for controlling semiconductor processing tool 1100. System process controller 1122 may operate process module control subsystems, such as gas control subsystems, pressure control subsystems, temperature control subsystems, electrical control subsystems, and mechanical control subsystems. Such control subsystems may receive various signals provided by sensors, relays, and controllers and make suitable adjustments in response.

System process controller 1122 comprises a computing system that includes a data-holding subsystem 1124 and a logic subsystem 1126. Data-holding subsystem 1124 may include one or more physical, non-transitory devices configured to hold data and/or instructions executable by logic subsystem 1126 to implement the methods and processes described herein. Logic subsystem 1126 may include one or more physical devices configured to execute one or more instructions stored in data-holding subsystem 1124. Logic subsystem 1126 may include one or more processors that are configured to execute software instructions.

In some embodiments, such instructions may control the execution of process recipes. Generally, a process recipe includes a sequential description of process parameters used to process a substrate, such parameters including, but not limited to, time, temperature, pressure, and concentration, as well as various parameters describing electrical, mechanical, and environmental aspects of the tool during substrate processing. The instructions may also control the execution of various maintenance recipes used during maintenance procedures.

In some embodiments, such instructions may be stored on removable computer-readable storage media 1128, which may be used to store and/or transfer data and/or instructions executable to implement the methods and processes described herein, excluding a signal per se. It will be appreciated that any suitable removable computer-readable storage media 1128 may be employed without departing from the scope of the present disclosure. Non-limiting examples include DVDs, CD-ROMs, floppy discs, and flash drives.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A film deposition reactor for processing a substrate, the film deposition reactor comprising:

a process gas distributor comprising:

- a support structure;
- one or more plasma gas supply lines included within the support structure;
- one or more precursor supply lines included within the support structure;
- a plasma gas distributor supported by the support structure, the plasma gas distributor comprising a plasma gas-feed inlet coupled to at least one of the one or more plasma gas supply lines and located to supply plasma gas to a plasma generation region within the film deposition reactor, and
- a precursor gas distributor located downstream of the plasma gas distributor and supported by the support structure, the precursor gas distributor comprising a precursor gas-feed inlet coupled to at least one of the one or more precursor supply lines and located to supply film precursor gas downstream of the plasma generation region; and a susceptor configured to support the substrate so that a film deposition surface of the substrate is exposed to a reaction region formed downstream of the process gas distributor.

2. The film deposition reactor of claim 1, further comprising an insulator coupled to the plasma gas distributor and the precursor gas distributor.

3. The film deposition reactor of claim 1, wherein the plasma gas distributor comprises a plurality of radially arranged plasma gas feed inlets.

4. The film deposition reactor of claim 1, wherein the plasma gas-feed inlet is angled to direct exiting plasma gas within the plasma generation region.

5. The film deposition reactor of claim 1, wherein the precursor gas distributor comprises a plurality of plasma passthroughs.

6. The film deposition reactor of claim 5, wherein the plasma passthroughs positioned farther from a center of the precursor gas distributor have larger openings relative to one or more plasma passthroughs positioned closer to the center.

7. The film deposition reactor of claim 1, further comprising an insulating confinement vessel configured to maintain the plasma generation region at a reduced pressure within the film deposition reactor.

8. The film deposition reactor of claim 7, further comprising an ICP coil arranged around a portion of a sidewall of the insulating confinement vessel and positioned so that the sidewall separates the plasma generation region from the ICP coil.

9. The film deposition reactor of claim 1, wherein the precursor gas distributor comprises a plurality of azimuthal precursor gas distributors.

10. The film deposition reactor of claim 9, wherein the precursor gas distributor comprises a plurality of radial precursor gas distributors, and wherein the precursor gas distributor comprises a plurality of plasma pass-through openings formed between the plurality of azimuthal precursor gas distributors and the plurality of radial precursor gas distributors.

11. The film deposition reactor of claim 10, wherein the plurality of radial precursor gas distributors includes a precursor gas entry location positioned at a center of the precursor gas distributor.

12. The film deposition reactor of claim 10, wherein the plurality of radial precursor gas distributors includes one or more precursor gas entry locations positioned between a center and an outer edge of the precursor gas distributor.

13. The film deposition reactor of claim 1, where the precursor gas distributor comprises a no-mix showerhead assembly including a plurality of precursor gas-feed inlets and a plurality of plasma pass-through openings.

14. A process gas distribution assembly for a film deposition reactor configured to process a substrate, the process gas distribution assembly comprising:

a support structure having a precursor gas supply line and a plasma gas supply line located therein;

a plasma gas distributor coupled to and supported by the support structure, the plasma gas distributor including one or more plasma gas-feed inlets fluidly coupled to the plasma gas supply line; and a precursor gas distributor located downstream of the plasma gas distributor and coupled to and supported by the support structure and extending away from the plasma gas distributor, the precursor gas distributor including one or more precursor gas-feed inlets fluidly coupled to the precursor gas supply line.

15. The process gas distribution assembly of claim 14, further comprising an insulating confinement vessel configured to maintain the plasma generation region at a reduced pressure within the film deposition reactor.

16. The process gas distribution assembly of claim 14, further comprising an ICP coil arranged around a portion of a sidewall of an insulating confinement vessel and positioned so that the sidewall separates the plasma generation region from the ICP coil.

17. The process gas distribution assembly of claim 14, further comprising an electrical insulator disposed between the plasma gas distributor and the precursor gas distributor.

* * * * *